(12) United States Patent
Kogut et al.

(10) Patent No.: US 7,704,773 B2
(45) Date of Patent: Apr. 27, 2010

(54) MEMS DEVICES HAVING SUPPORT STRUCTURES WITH SUBSTANTIALLY VERTICAL SIDEWALLS AND METHODS FOR FABRICATING THE SAME

(75) Inventors: Lior Kogut, Sunnyvale, CA (US); Chengbin Qiu, Cupertino, CA (US); Chun-Ming Wang, Fremont, CA (US); Stephen Zee, San Jose, CA (US); Fan Zhong, Fremont, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 482 days.

(21) Appl. No.: 11/506,600

(22) Filed: Aug. 18, 2006

(65) Prior Publication Data

US 2007/0042524 A1     Feb. 22, 2007

Related U.S. Application Data

(60) Provisional application No. 60/710,019, filed on Aug. 19, 2005.

(51) Int. Cl.
*H01L 21/00* (2006.01)
(52) U.S. Cl. ............... 438/52; 438/50; 257/E21.613; 257/E29.324
(58) Field of Classification Search .......... 438/52, 438/53, 619, 50; 257/E21.613, E29.324
See application file for complete search history.

(56) References Cited

U.S. PATENT DOCUMENTS

| | | | |
|---|---|---|---|
| 4,566,935 A | 1/1986 | Hornbeck | |
| 4,710,732 A | 12/1987 | Hornbeck | |
| 4,859,060 A | 8/1989 | Kitagiri et al. | |
| 4,956,619 A | 9/1990 | Hornbeck | |
| 5,233,456 A | 8/1993 | Nelson | |
| 5,287,215 A | 2/1994 | Warde et al. | |
| 5,454,906 A | 10/1995 | Baker et al. | |
| 5,485,304 A | 1/1996 | Kaeriyama | |
| 5,497,262 A * | 3/1996 | Kaeriyama | ............... 359/223.1 |
| 5,526,172 A | 6/1996 | Kanack | |

(Continued)

FOREIGN PATENT DOCUMENTS

CN      092109265      4/2003

(Continued)

OTHER PUBLICATIONS

Fan et al., "Channel Drop Filters in Photonic Crystals," Optics Express, vol. 3, No. 1 (1998).

(Continued)

*Primary Examiner*—Quoc D Hoang
(74) *Attorney, Agent, or Firm*—Knobbe Martens Olson & Bear LLP

(57) ABSTRACT

Embodiments of MEMS devices include support structures having substantially vertical sidewalls. Certain support structures are formed through deposition of self-planarizing materials or via a plating process. Other support structures are formed via a spacer etch. Other MEMS devices include support structures at least partially underlying a movable layer, where the portions of the support structures underlying the movable layer include a convex sidewall. In further embodiments, a portion of the support structure extends through an aperture in the movable layer and over at least a portion of the movable layer.

10 Claims, 19 Drawing Sheets

U.S. PATENT DOCUMENTS

| | | | |
|---|---|---|---|
| 5,526,951 A * | 6/1996 | Bailey et al. ................ 216/24 |
| 5,600,383 A | 2/1997 | Hornbeck |
| 5,606,441 A | 2/1997 | Florence et al. |
| 5,631,782 A | 5/1997 | Smith et al. |
| 5,646,768 A | 7/1997 | Kaeiyama |
| 5,650,881 A | 7/1997 | Hornbeck |
| 5,673,139 A | 9/1997 | Johnson |
| 5,745,281 A | 4/1998 | Yi et al. |
| 5,751,469 A | 5/1998 | Arney et al. |
| 5,783,864 A | 7/1998 | Dawson et al. |
| 5,784,212 A | 7/1998 | Hornbeck |
| 5,808,781 A | 9/1998 | Arney et al. |
| 5,825,528 A | 10/1998 | Goosen |
| 5,838,484 A | 11/1998 | Goossen et al. |
| 5,867,302 A | 2/1999 | Fleming et al. |
| 5,914,803 A | 6/1999 | Hwang et al. |
| 5,920,421 A | 7/1999 | Choi |
| 5,998,293 A | 12/1999 | Dawson et al. |
| 6,038,056 A | 3/2000 | Florence et al. |
| 6,040,937 A | 3/2000 | Miles |
| 6,100,477 A | 8/2000 | Randall et al. |
| 6,284,560 B1 | 9/2001 | Jech et al. |
| 6,358,021 B1 | 3/2002 | Cabuz |
| 6,447,126 B1 | 9/2002 | Hornbeck |
| 6,465,355 B1 | 10/2002 | Horsley |
| 6,574,033 B1 | 6/2003 | Chui et al. |
| 6,602,791 B2 | 8/2003 | Ouellet et al. |
| 6,618,187 B2 | 9/2003 | Pilossof |
| 6,632,698 B2 | 10/2003 | Ives |
| 6,650,455 B2 | 11/2003 | Miles |
| 6,657,832 B2 | 12/2003 | Williams et al. |
| 6,674,562 B1 | 1/2004 | Miles |
| 6,677,225 B1 | 1/2004 | Ellis et al. |
| 6,680,792 B2 | 1/2004 | Miles |
| 6,713,235 B1 | 3/2004 | Ide et al. |
| 6,778,306 B2 | 8/2004 | Sniegowski et al. |
| 6,788,175 B1 | 9/2004 | Prophet et al. |
| 6,794,119 B2 | 9/2004 | Miles |
| 6,867,896 B2 | 3/2005 | Miles |
| 6,882,458 B2 | 4/2005 | Lin et al. |
| 6,967,757 B1 | 11/2005 | Allen et al. |
| 6,987,432 B2 | 1/2006 | Lutz et al. |
| 6,991,995 B2 | 1/2006 | Aulnette et al. |
| 6,995,890 B2 | 2/2006 | Lin |
| 7,078,293 B2 | 7/2006 | Lin et al. |
| 7,119,945 B2 | 10/2006 | Cummings et al. |
| 7,123,216 B1 | 10/2006 | Miles |
| 7,198,973 B2 | 4/2007 | Lin et al. |
| 7,250,315 B2 | 7/2007 | Miles |
| 2001/0040675 A1 | 11/2001 | True et al. |
| 2002/0027636 A1 | 3/2002 | Yamada |
| 2002/0054422 A1 | 5/2002 | Carr et al. |
| 2002/0058422 A1 | 5/2002 | Jang et al. |
| 2002/0071169 A1 | 6/2002 | Bowers et al. |
| 2002/0110948 A1 | 8/2002 | Huang et al. |
| 2002/0131682 A1 | 9/2002 | Nasiri et al. |
| 2002/0146200 A1 | 10/2002 | Kudrlc et al. |
| 2002/0186483 A1 | 12/2002 | Hagelin et al. |
| 2003/0016428 A1 | 1/2003 | Kato et al. |
| 2003/0036215 A1 | 2/2003 | Reid |
| 2003/0053078 A1 | 3/2003 | Missey et al. |
| 2003/0053233 A1 | 3/2003 | Felton |
| 2003/0119221 A1 | 6/2003 | Cunningham et al. |
| 2003/0123126 A1 | 7/2003 | Meyer et al. |
| 2003/0210851 A1 | 11/2003 | Fu et al. |
| 2003/0231373 A1 | 12/2003 | Kowarz et al. |
| 2004/0027671 A1 | 2/2004 | Wu et al. |
| 2004/0035821 A1 | 2/2004 | Doan et al. |
| 2004/0051929 A1 | 3/2004 | Sampsell et al. |
| 2004/0080035 A1 | 4/2004 | Delapierre |
| 2004/0100677 A1 | 5/2004 | Huibers et al. |
| 2004/0100680 A1 | 5/2004 | Huibers et al. |
| 2004/0125347 A1 | 7/2004 | Patel et al. |
| 2004/0136045 A1 | 7/2004 | Tran |
| 2004/0207497 A1 | 10/2004 | Hsu et al. |
| 2004/0207898 A1 | 10/2004 | Lin et al. |
| 2004/0209195 A1 | 10/2004 | Lin |
| 2004/0233498 A1 | 11/2004 | Starkweather et al. |
| 2005/0024557 A1 | 2/2005 | Lin |
| 2005/0036095 A1 | 2/2005 | Yeh et al. |
| 2005/0194867 A1 | 9/2005 | Kawakubo et al. |
| 2005/0195464 A1 | 9/2005 | Faase et al. |
| 2006/0006138 A1 | 1/2006 | Lin |
| 2006/0024620 A1 | 2/2006 | Nikkel et al. |
| 2006/0024880 A1 | 2/2006 | Chui et al. |
| 2006/0066935 A1 | 3/2006 | Cummings et al. |
| 2006/0066936 A1 | 3/2006 | Chui et al. |
| 2006/0076311 A1 | 4/2006 | Tung et al. |
| 2006/0077502 A1 | 4/2006 | Tung et al. |
| 2006/0077509 A1 | 4/2006 | Tung et al. |
| 2006/0079048 A1 | 4/2006 | Sampsell et al. |
| 2006/0256420 A1 | 11/2006 | Miles et al. |
| 2007/0019280 A1 | 1/2007 | Sasagawa et al. |
| 2007/0019923 A1 | 1/2007 | Sasagawa et al. |
| 2007/0047900 A1 | 3/2007 | Sampsell et al. |
| 2007/0064760 A1 | 3/2007 | Kragh |
| 2007/0269748 A1 | 11/2007 | Miles |
| 2008/0041817 A1 | 2/2008 | Lin |
| 2008/0055699 A1 | 3/2008 | Lin |
| 2008/0068699 A1 | 3/2008 | Miles |

FOREIGN PATENT DOCUMENTS

| | | |
|---|---|---|
| DE | 198 47 455 | 4/2004 |
| EP | 0 069 226 | 1/1983 |
| EP | 0 695 959 | 2/1996 |
| EP | 0 788 005 | 8/1997 |
| EP | 1 275 997 | 1/2003 |
| JP | 9-127439 | 5/1997 |
| JP | 11-097799 | 4/1999 |
| JP | 2001-085519 | 3/2001 |
| JP | 2002-062490 | 2/2002 |
| JP | 2002-207182 | 7/2002 |
| JP | 2004-212656 | 7/2004 |
| WO | WO 02/079853 | 10/2002 |
| WO | WO 03/014789 | 2/2003 |
| WO | WO 2004/015741 | 2/2004 |
| WO | WO 2004/055885 | 7/2004 |

OTHER PUBLICATIONS

Raley et al., "A Fabry-Perot Microinterferometer for Visible Wavelengths," IEEE Solid-State Sensor and Actuator Workshop, Hilton Head, SC, pp. 170-173 (1992).

International Search Report and Written Opinion of ISA dated Dec. 21, 2006 for PCT/US2006/032691.

Aratani K. et al., "Surface Micromachined Tuneable Interferometer Array," Sensors and Actuators A, Elsevier Sequoia S.A., Lausanne, CH, vol. A43, No. 1/3, May 1, 1994, pp. 17-23.

Wang et al., Flexible curcuit-based RF MEMS Switches, Proceedings of 2001 ASME International Mechanical Engineering Congress and Exposition, pp. 1-6, 2001.

IPRP for PCT/US2006/032691 filed Aug. 17, 2006.

ISR and WO for PCT/US2006/032516 filed Aug. 17, 2006.

IPRP for PCT/US2006/032516 filed Aug. 17, 2006.

ISR and WO for PCT/US2006/032511 filed Aug. 17, 2006.

IPRP for PCT/US2006/032511 filed Aug. 17, 2006.

Office Action dated Jan. 23, 2009, in U.S. Appl. No. 11/506,594.

Office Action dated Jul. 28, 2008 in U.S. Appl. No. 11/506,594.

Dai et al., "A CMOS surface micromachined pressure sensor," Journal of the Chinese institute of Engineers, 1999, vol. 22, No. 3 (May), pp. 375-380.

Office Action dated Jun. 25, 2009, in U.S. Appl. No. 11/506,594.

* cited by examiner

|  | Column Output Signals | |
|---|---|---|
|  | $+V_{bias}$ | $-V_{bias}$ |
| Row Output Signals  0 | Stable | Stable |
| $+\Delta V$ | Relax | Actuate |
| $-\Delta V$ | Actuate | Relax |

MEMS DEVICES HAVING SUPPORT STRUCTURES WITH SUBSTANTIALLY VERTICAL SIDEWALLS AND METHODS FOR FABRICATING THE SAME

CROSS-REFERENCE TO RELATED APPLICATIONS

This application claims priority under 35 U.S.C. §119(e) to U.S. Provisional Application Ser. No. 60/710,019, filed Aug. 19, 2005, which is hereby incorporated by reference in its entirety.

BACKGROUND OF THE INVENTION

Microelectromechanical systems (MEMS) include micromechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one embodiment, a method of fabricating a MEMS device is provided, the method including providing a substrate, depositing an electrode layer over the substrate, depositing a sacrificial layer over the electrode layer, patterning the sacrificial layer to form an aperture, depositing a layer of inorganic self-planarizing material over the sacrificial layer, such that it fills the aperture, etching back the layer of self-planarizing material to a level at or below the upper surface of the sacrificial layer to form a support structure, and depositing a movable layer over the support structure.

In another embodiment, a method of fabricating a MEMS device is provided, the method including providing a substrate, depositing an electrode layer over the substrate, depositing a sacrificial layer over the electrode layer, patterning the sacrificial layer to define an aperture, forming a metallic seed layer, where the metallic seed layer does not extend over unpatterned portions of the sacrificial layer, forming a support structure within the aperture via a plating process, and depositing a movable layer over the support structure.

In another embodiment, a method of fabricating a MEMS device is provided, the method including providing a substrate, depositing an electrode layer over the substrate, depositing a sacrificial layer over the electrode layer, patterning the sacrificial layer to define an aperture having a substantially vertical sidewall, depositing a layer of conformal support material over the vertical sidewall and over an upper surface of the sacrificial layer, performing a directional etch to form a spacer structure located within the aperture and against the substantially vertical sidewall, where the directional etch removes the support material overlying the upper surface of the sacrificial layer, and depositing a movable layer over the support structure.

In another embodiment, a method of fabricating a MEMS device is provided, the method including providing a substrate, depositing an electrode layer over the substrate, depositing a sacrificial layer over the electrode layer, depositing a movable layer over the sacrificial layer, patterning the movable layer to form an aperture extending through the movable layer, thereby exposing a portion of the sacrifical layer, etching the exposed portion of the sacrificial layer to form a cavity extending through the sacrificial layer and undercutting a portion of the movable layer, and depositing a layer of self-planarizing support material to fill the cavity.

In another embodiment, a MEMS device is provided, including a substrate, an electrode layer located over the substrate, a movable layer located over the electrode layer, where the movable layer is generally spaced apart from the electrode layer by an air gap, and an inorganic support structure underlying the movable layer, where the inorganic support structure includes a substantially vertical sidewall, and where the inorganic support structure is spaced apart from the substrate by at least one intermediate layer.

In another embodiment, a MEMS device is provided, including a substrate, an electrode layer located over the substrate, a movable layer located over the electrode layer, where the movable layer is generally spaced apart from the electrode layer by an air gap, the movable layer including an aperture extending through the movable layer, and a support structure located at least partially beneath the aperture in the movable layer, the support structure including a convex sidewall portion located underneath the movable layer.

In another embodiment, a MEMS device, is provided, including first means for electrically conducting, second means for electrically conducting, and means for supporting the second conducting means over the first conducting means, where the second conducting means is movable relative to the first conducting means in response to generating electrostatic potential between the first and second conducting means, and where the supporting means extend through an aperture in the second conducting means and enclose at least a portion of the second conducting means.

In another embodiment, a method of manufacturing a MEMS device is provided, the method including forming a lower sacrificial layer over a substrate, forming a movable layer over the first sacrificial layer, forming an upper sacrificial layer over the movable layer, where the thickness of the second sacrificial layer is between 30 and 500 angstroms, forming a rigid ceiling layer over the second sacrificial layer, and forming a support structure which provides support to both the movable layer and the rigid ceiling layer.

In another embodiment, a MEMS device is provided, including a movable layer spaced apart from a substrate by a lower air gap, a rigid ceiling layer spaced apart from the movable layer by an upper air gap, where the height of the upper air gap is between 30 and 500 angstroms, and a support structure which provides support to both the movable layer and the rigid ceiling layer.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

While it is desirable to provide additional support to movable layers in MEMS elements in order to ensure the desired spacing is maintained between the movable layer and other components, the inclusion of such support structures inhibits the motion of the movable layer in the area surrounding the support structures, and may have an adverse effect on the performance of the MEMS device, effectively reducing the active area of the MEMS device. It is thus desirable to minimize the footprint of these support structures while providing the desired level of support. In certain embodiments, this can be achieved through the use of support structures having substantially vertical sidewalls. In one embodiment, the fabrication of such support structures can be achieved through the use of a self-planarizing material. In further embodiments, these support structures may extend through an aperture in the movable layer and enclose a portion of the movable layer. In alternate embodiments, directional etches or electroplating techniques can be used to provide such support structures.

Figure 1:
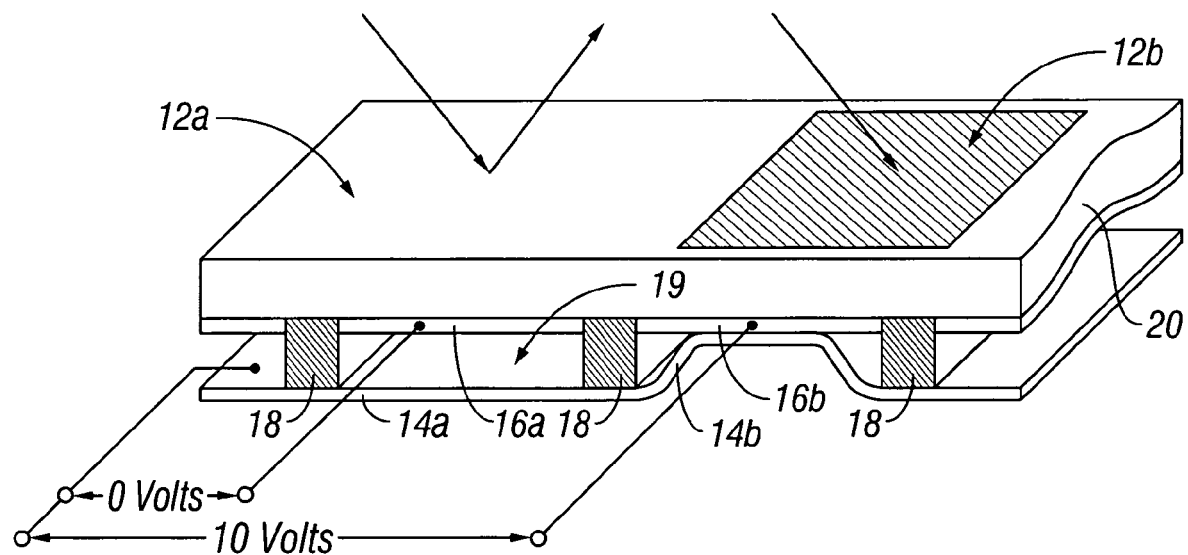
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
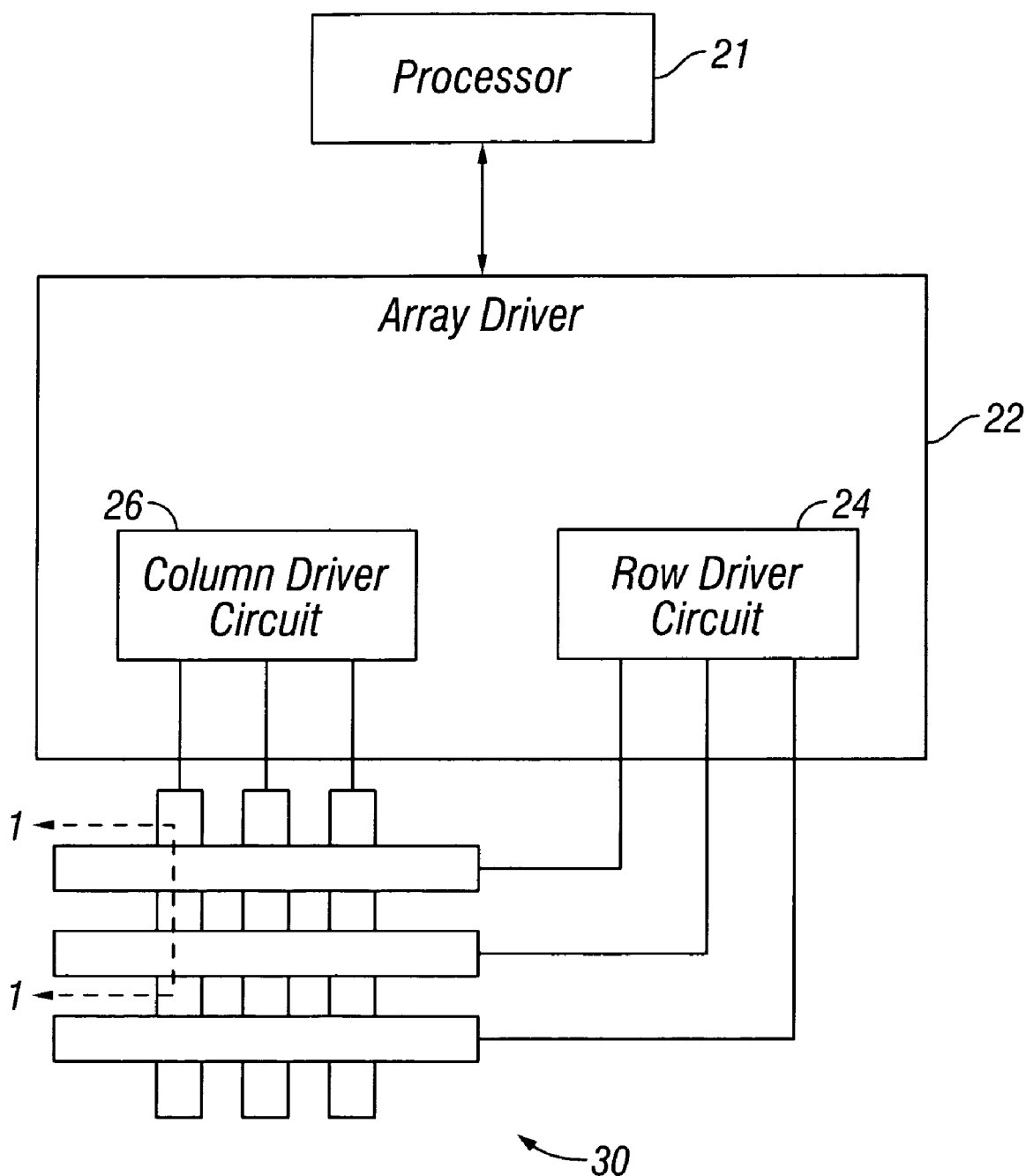
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
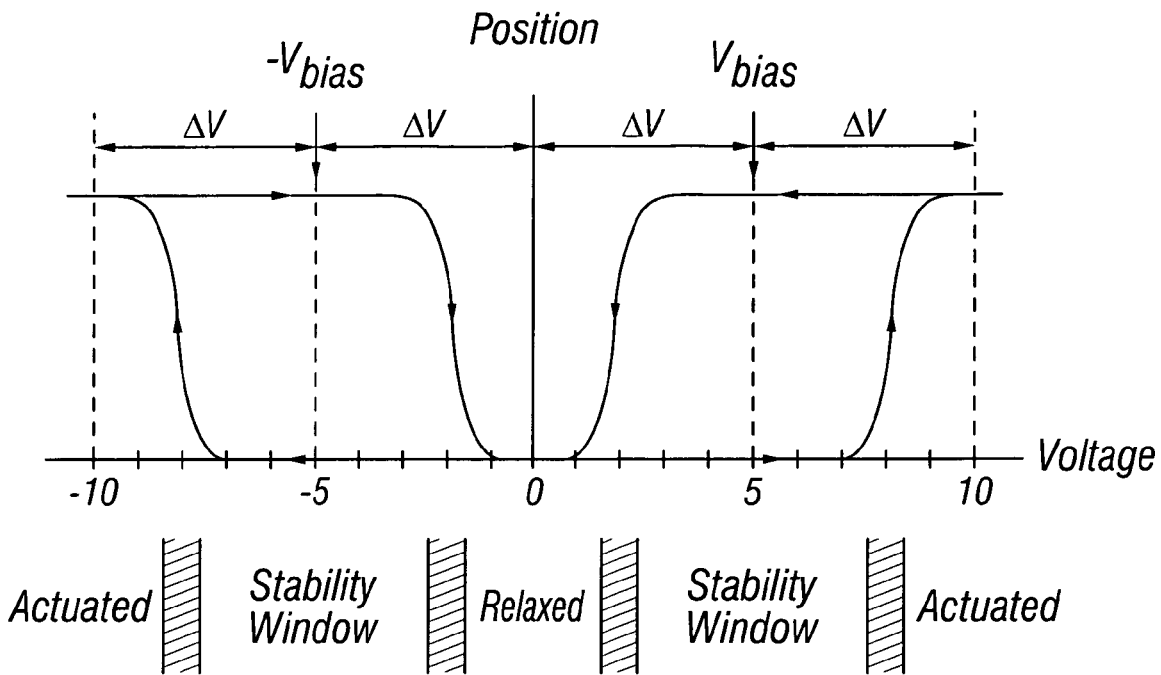
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
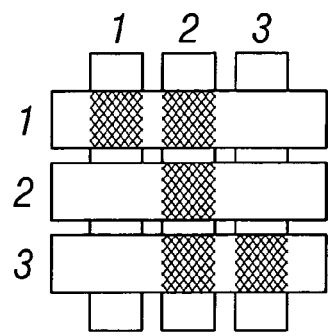
FIG. 5A illustrates one exemplary frame of display data in the 3×3 interferometric modulator display of FIG. 2.
Figure 5B:
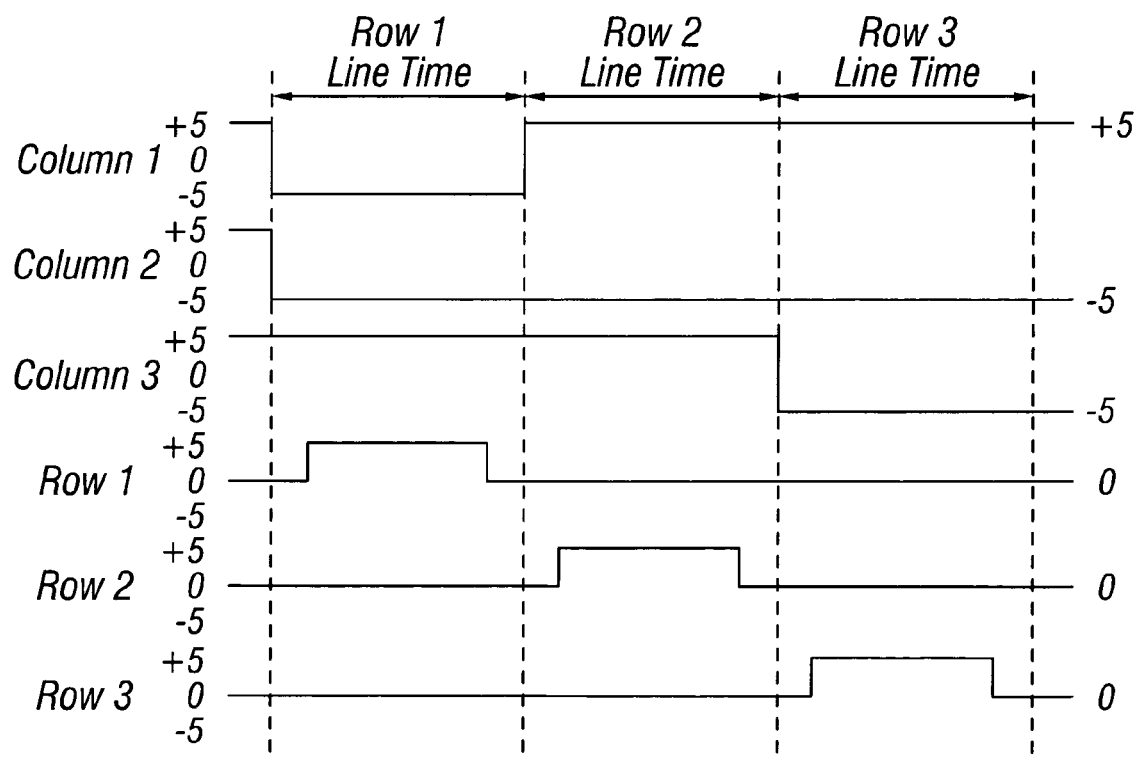
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
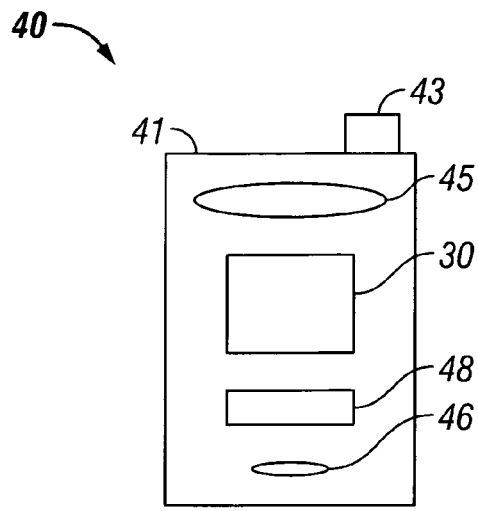
FIGS. 6A and 6B are system block diagrams illustrating an embodiment of a visual display device comprising a plurality of interferometric modulators.
Figure 6B:
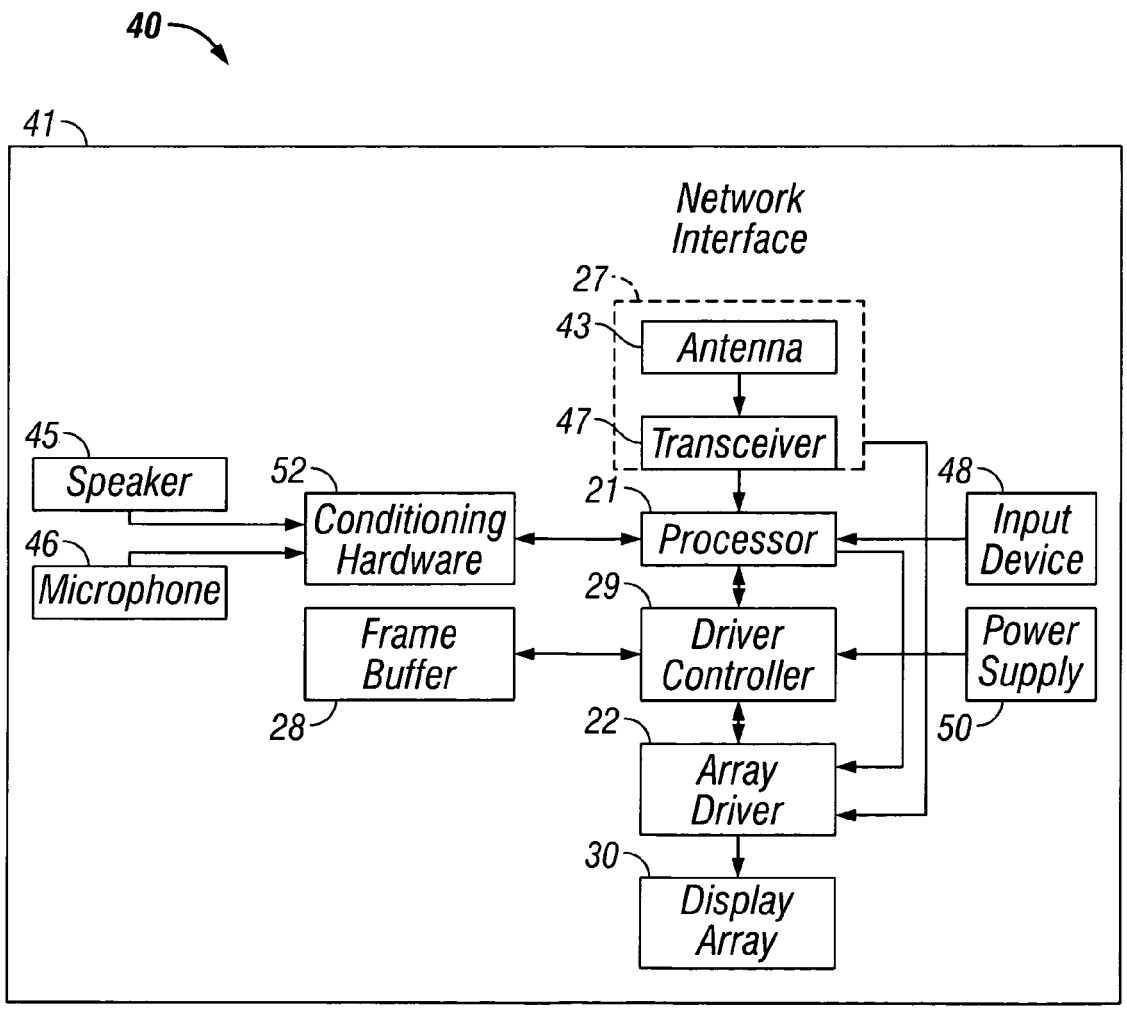

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of the exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be memory device such as a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, the array driver 22, and the display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
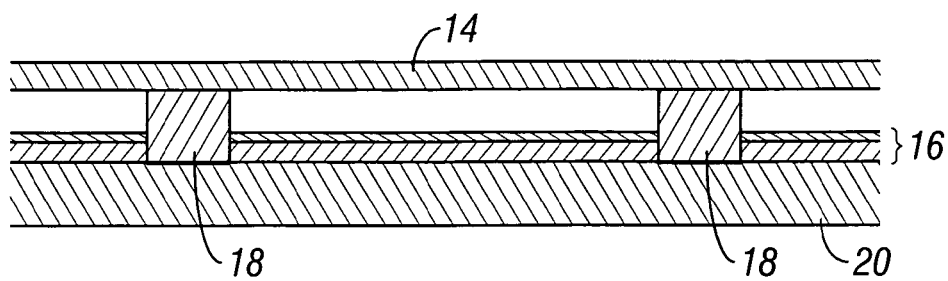
FIG. 7A is a cross section of the device of FIG. 1.
Figure 7B:
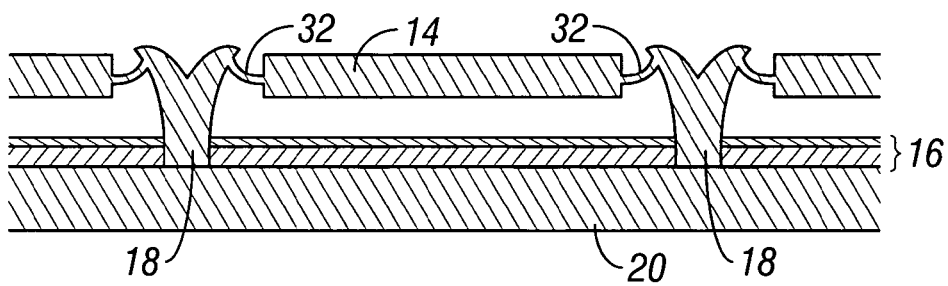
FIG. 7B is a cross section of an alternative embodiment of an interferometric modulator.
Figure 7C:
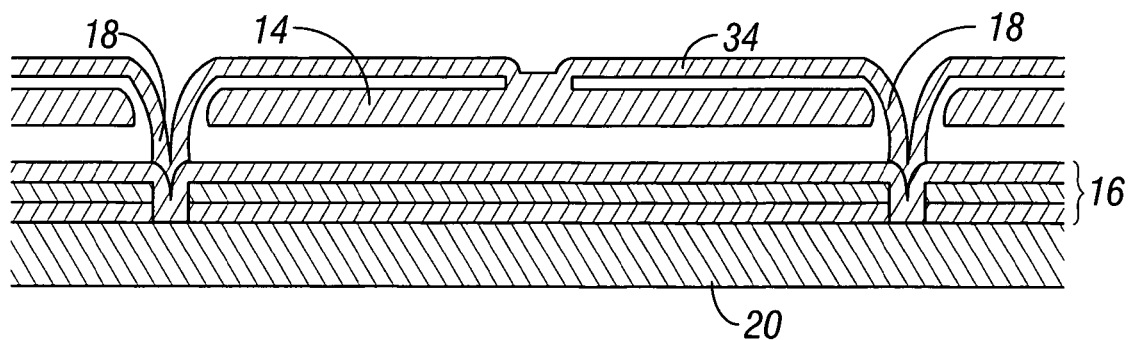
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports 18 at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support structures, which can take the form of isolated pillars or posts and/or continuous walls or rails. The embodiment illustrated in FIG. 7D has support structures 18 that include support plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts 18 are formed of a planarization material, which is used to form the support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 7D:
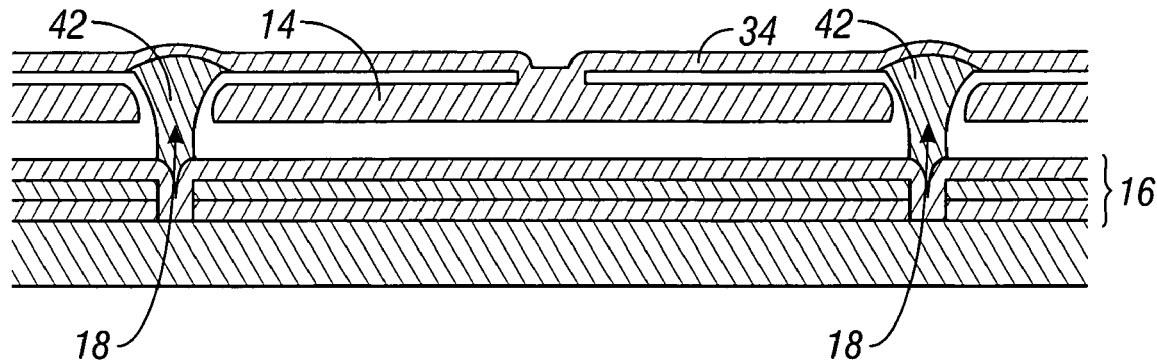
FIG. 7D is a cross section of yet another alternative embodiment of an interferometric modulator.
Figure 7E:
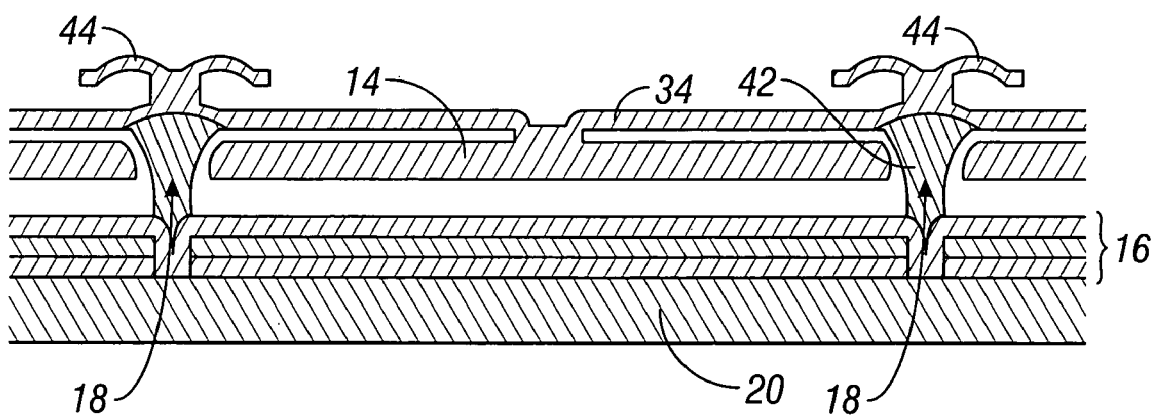
FIG. 7E is a cross section of an additional alternative embodiment of an interferometric modulator.

In certain embodiments, it may be desirable to provide additional support to a movable layer such as the movable reflective layer 14 illustrated in FIG. 7A, or the combination of mechanical layer 34 and movable reflective layer 14 of FIGS. 7C-7E. In optical MEMS, such as an interferometric modulator, the movable layer may comprise a reflective sublayer and a mechanical sublayer, as will be discussed in greater detail below. Such support may be provided by a series of support structures which may be located along the edges of an individual modulator element and/or in the interior of such an element. In various embodiments, these support structures may be located either over or underneath a movable layer. In alternate embodiments, support structures may extend through an aperture formed in the mechanical layer, such that support is provided from both above and below the mechanical layer. As used herein, the term "rivet" generally refers to a patterned layer overlying a mechanical layer in a MEMS device, usually in a recess or depression in the post or support region, to lend mechanical support for the mechanical layer. Preferably, though not always, the rivet includes wings overlying an upper surface of the mechanical layer to add stability and predictability to the mechanical layer's movement. Similarly, support structures underlying a mechanical layer in a MEMS device to lend mechanical support for the mechanical layer are generally referred to herein as support "posts." In many of the embodiments herein, the preferred materials are inorganic for stability relative to organic resist materials.

Figure 8:
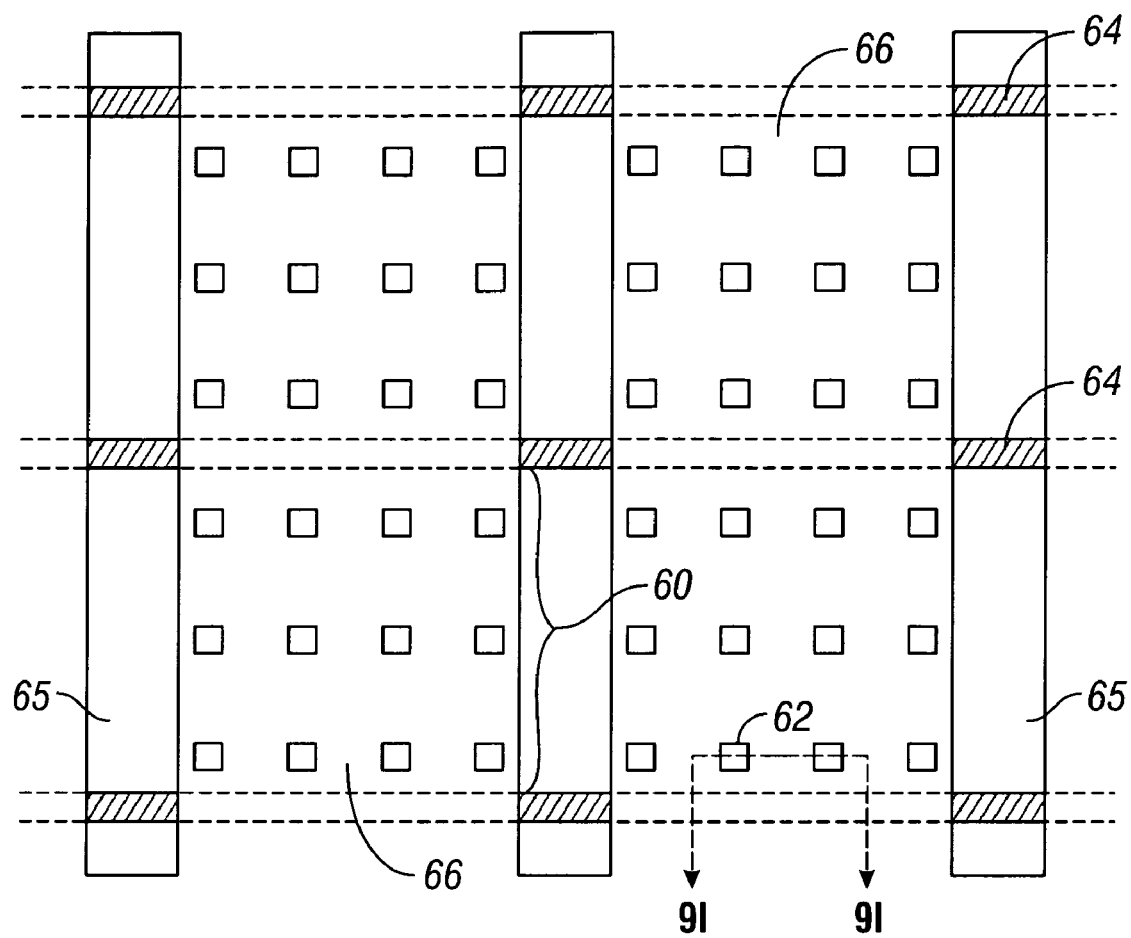
FIG. 8 is a top plan view of an array of MEMS elements in which the individual elements comprise support structures.

An exemplary layout of such support structures is shown in FIG. 8, which depicts an array of MEMS elements. In certain embodiments, the array may comprise an array of interferometric modulators, but in alternate embodiments, the MEMS elements may comprise any MEMS device having a movable layer. It can be seen that support structures 62 are located both along the edges of a movable layer 66 and in the interior of a MEMS element, in this example an interferometric modulator element 60. Certain support structures may comprise rail structures 64, which extend across the gap 65 between two adjacent movable layers 66. It can be seen that movable layer 66 comprises a strip of deformable material extending through multiple adjacent elements 60 within the same column. The rail structure 64 run parallel with lowe electrodes, which define rows crossing the upper electrodes defined by the strips of the movable layer 66. The support structures 62 serve to stiffen the movable layer 66 within the elements or pixels 60.

Advantageously, these support structures 62 are made small relative to the surrounding area of the modulator element 60. As the support posts constrain deflection of the movable layer 66 and may generally be opaque, the area underneath and immediately surrounding the support structures 62 is not usable as active area in a display, as the movable layer in those areas is not movable to a fully actuated position (e.g., one in which a portion of the lower surface of the movable layer 14 of FIG. 7A is in contact with the upper surface of the optical stack 16). Because this may result in undesirable optical effects in the areas surrounding the post, a dark or "black" mask layer may advantageously be provided between the support structures and the viewer to avoid excessive reflection in these regions that may wash out the intended color.

In addition, as the area immediately surrounding the support structure is not useable as an active area in the display, it is desirable to minimize the size of the support structures to the extent possible while still providing the desired amount of support. In certain embodiments, the formation of these support structures involves the deposition of layers over tapered underlying layers, so as to permit conformal deposition of layers which form the support structure, resulting in support structures having tapered sidewall portions. While such embodiments ensure the conformal deposition of the layers which form the support structure, the tapered sidewall portions may make the support structure larger than desirable. However, embodiments of support structures which need not include a tapered sidewall portion are discussed below.

In certain embodiments, a spin-on material, such as a spin-on glass or Nissan Hardcoat, can be used to form various support structures, including rivet structures and inorganic post structures. In one embodiment, described with respect to FIGS. 9A-9J, spin-on glass or other self-planarizing material (other than resist) is used to form post structures.

Figure 9A:
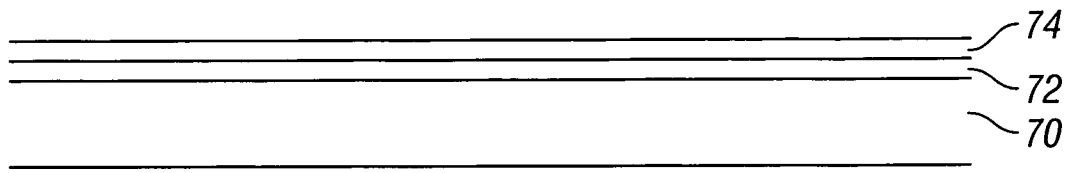
FIGS. 9A-9I are schematic cross-sections illustrating steps in a method for fabricating a MEMS device having a support structure formed from a self-planarizing material.

In FIG. 9A, it can be seen that a transparent or light-transmissive substrate 70 is provided, which may comprise, for example, glass or a transparent polymeric material. A conductive layer 72, which may comprise indium-tin-oxide (ITO), is then deposited over the transparent substrate and a partially reflective layer 74, which may comprise chromium, is deposited over the conductive layer 72. Although in one embodiment conductive layer 72 may comprise ITO, and may be referred to as such at various points in the below specification, it will be understood that the layer 72 may comprise any suitable conductive material, and need not be transparent for non-optical MEMS structures. Similarly, although sometimes referred to as a chromium layer, partially reflective layer 74 may comprise any suitable partially reflective layer, and may be omitted for non-optical MEMS structures.

Figure 9B:
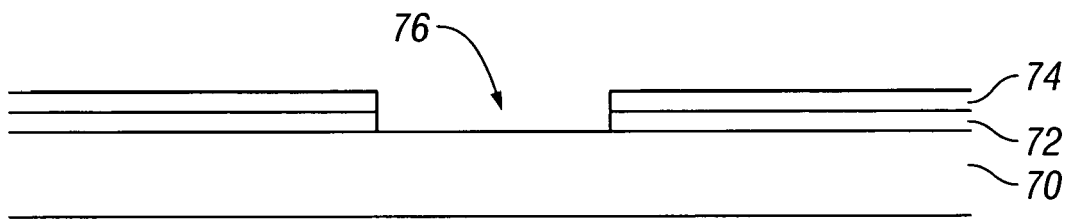

The conductive layer 72 and partially reflective layer 74 are then patterned and etched to form bottom electrodes, also referred to as row electrodes, which run cross-wise (e.g., perpendicular) to the movable layer 66 of FIG. 8 and which will be used to address a row of MEMS elements. In certain embodiments, the conductive and partially reflective layers 72 and 74 may advantageously also be patterned and etched to remove the ITO and chromium underlying the areas where the support post structures will be located, forming apertures 76 as depicted in FIG. 9B. This patterning and etching is preferably done by the same process which forms the row electrodes. The removal of ITO and chromium (or other conductive materials) underlying the support structures helps to minimize the risk of shorting between an overlying conductive layer, such as the movable layer, and the bottom electrode. Thus, FIG. 9B and the subsequent figures depict a cross-section of a continuous row electrode formed by layers 72 and 74, in which isolated apertures 76 have been etched, taken along a line extending through those apertures. In other embodiments in which the conductive layer 72 and partially reflective layer 74 are not etched to form apertures 76, a dielectric layer, discussed below, may provide sufficient protection against shorting between the bottom electrode and the movable layer.

Figure 9C:
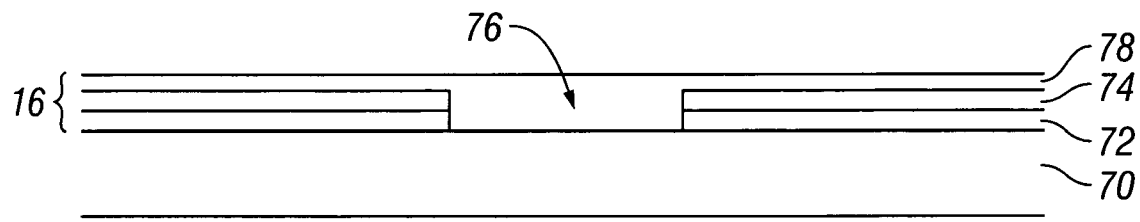

The conductive layer 72 and partially reflective layer 74 may be patterned via photolithography and etched via, for example, commercially available wet etches. Chromium wet etches include solutions of acetic acid ($C_2H_4O_2$) and cerium ammonium nitrate [$Ce(NH_4)_2(NO_3)_6$]. ITO wet etches include HCl, a mixture of HCl and $HNO_3$, or a mixture of $FeCl_3$/HCl/DI in a 75%/3%/22% ratio and $H_2O$. Once the apertures 76 have been formed, a dielectric layer 78 is deposited over the conductive and partially reflective layers 72 and 74, as seen in FIG. 9C, forming the optical stack 16. In certain embodiments, the dielectric layer may comprise $SiO_2$ or $SiN_x$, although a wide variety of suitable materials may be used.

A variety of methods can be used to perform the patterning and etching processes discussed with respect to the various embodiments disclosed herein. The etches used may be either a dry etch or a wet etch, and may be isotropic or anisotropic. Suitable dry etches include, but are not limited to: $SF_6/O_2$, $CHF_3/O_2$, $SF_2/O_2$, $CF_4/O_2$, and $NF_3/O_2$. Generally, these etches are suitable for etching one or more of $SiO_x$, $SiN_x$, $SiO_xN_y$, spin-on glass, Nissan™ hard coat, and $TaO_x$, but other materials may also be etched by this process. Materials which are resistant to one or more of these etches, and may thus be used as etch barrier layers, include but are not limited to Al, Cr, Ni, and $Al_2O_3$. In addition, wet etches including but not limited to PAD etches, BHF, KOH, and phosphoric acid may be utilized in the processes described herein, and may generally be used to etch metallic materials. Generally, these etches may be isotropic, but can be made anisotropic through the use of a reactive ion etch (RIE), by ionizing the etch chemicals and shooting the ions at the substrate. The patterning may comprise the deposition of a photoresist (PR) layer (either positive or negative photoresist), which is then used to form a mask. Alternately, a hard mask can be utilized. In some embodiments, the hard mask may comprise metal or $SiN_x$, but it will be understood that the composition of the hard mask may depend on the underlying materials to be etched and the selectivity of the etch to be used. In The hard mask is typically patterned using a PR layer, which is then removed, and the hard mask is used as a mask to etch an underlying layer. The use of a hard mask may be particularly advantageous when a wet etch is being used, or whenever processing through a mask under conditions that a PR mask cannot handle (such as at high temperatures, or when using an oxygen-based etch). Alternate methods of removing layers may also be utilized, such as an ashing etch or lift-off processes.

The thickness and positioning of the layers forming the optical stack 16 determines the color reflected by the interferometric modulator element when the element is actuated (collapsed), bringing the movable layer 66 into contact with the optical stack 16. In certain embodiments, the optical stack is configured such that the interferometric modulator element reflects substantially no visible light (appears black) when the movable layer is in an actuated position. Typically, the thickness of the dielectric layer 78 is about 450 Å, although it will be understood that the desired thickness of the dielectric layer 78 will vary based on the refractive index of the material and the desired color reflected by the interferometric modulator in a collapsed state. While illustrated for simplicity as planar (which can be achieved if the dielectric layer 78 is a spin-on glass), the dielectric layer 78 is typically conformal over the patterned lower electrode formed from layers 72 and 74.

Figure 9D:
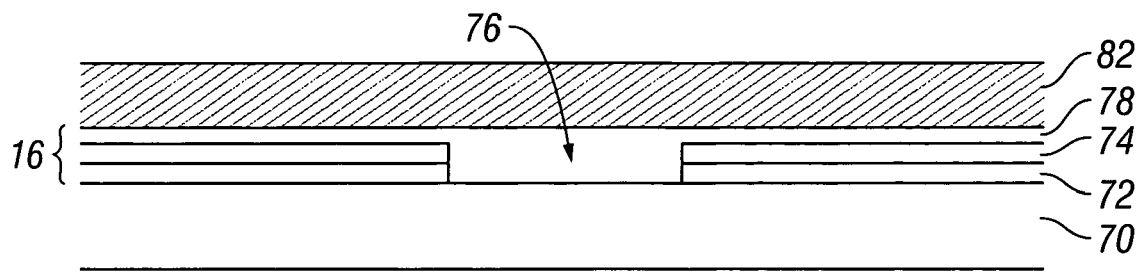

As seen in FIG. 9D, a layer 82 of sacrificial material is then deposited over the dielectric layer 78. In certain embodiments, this sacrificial layer 82 is formed from a material which is etchable by fluorine-based etchants, particularly $XeF_2$. For example, the sacrificial layer 82 may be formed from molybdenum or amorphous silicon (a-Si). In other embodiments, the sacrificial layer may comprise tantalum or tungsten. Other materials which are usable as sacrificial materials include silicon nitride, certain oxides, and organic materials. The thickness of the deposited sacrificial layer 82 will determine the distance between the optical stack 16 and the movable layer 66, thus defining the dimensions of the interferometric gap 19 (see FIG. 7A). As the height of the gap 19 determines the color reflected by the interferometric modulator element when in an unactuated position, the thickness of the sacrificial layer 82 will vary depending on the desired characteristics of the interferometric modulator. For instance, in an embodiment in which a modulator element that reflects green in the unactuated position is formed, the thickness of the sacrificial layer 82 may be roughly 2000 Å. In further embodiments, the sacrificial layer may have multiple thicknesses across an array of MEMS devices, such as in a multi-color display system where different interferometric gap sizes are used to produce different colors.

Figure 9E:
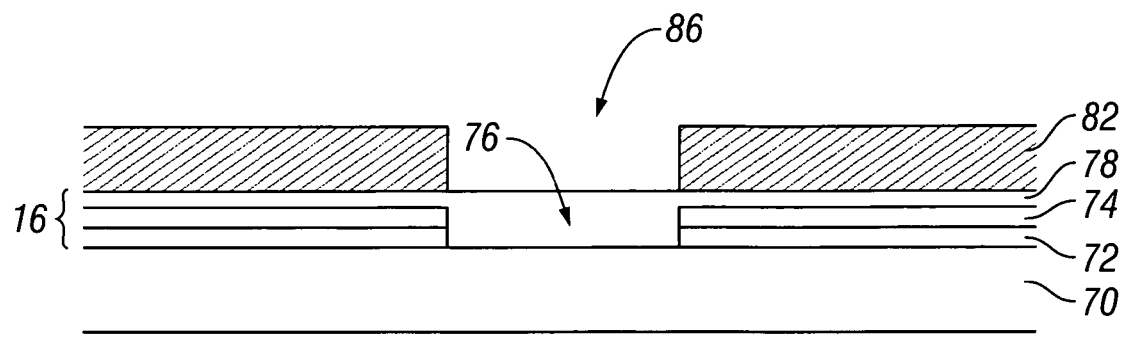

In FIG. 9E, it can be seen that the sacrificial layer 82 has been patterned and etched to form apertures 86. The apertures 86 overlie the apertures 76 cut into the layers 72 and 74 of ITO and chromium. These apertures 86 may be formed by masking the sacrificial layer, using photolithography, and then performing an etch to remove portions of the sacrificial material. Preferably a dry, directional etch is performed to obtain the near-vertical sidewalls shown. Preferably, the sidewalls slope less than about ±10° relative to vertical. Suitable dry etches include, but are not limited to, $SF_6$, $CF_4$, $Cl_2$, or any mixture of these gases with $O_2$ or a noble gas such as He or Ar.

Figure 9F:
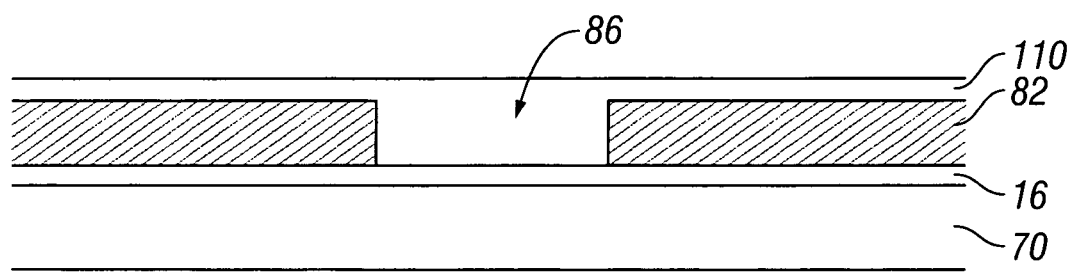

As can be seen in FIG. 9F, a layer 110 of spin-on material is then deposited over the patterned sacrificial layer 82, filling the apertures 86. As noted above, the edges of these apertures are substantially vertical rather than tapered, as the spin-on material will fill the apertures 86 as a result of the spinning process, which causes the spin-on material to flow to fill such apertures. The deposition of spin-on glass or other self-planarizing materials can be done in a variety of ways, including but not limited to exposure to a liquid precursor, spray deposition, ink jet deposition, extrusion of the spin-on material, application via a roller coater, and screen printing. The materials used in the formation of the support structure are preferably inorganic (e.g., SOG, which is a form of silicon oxide) for better stability relative to photoresist.

Figure 9G:
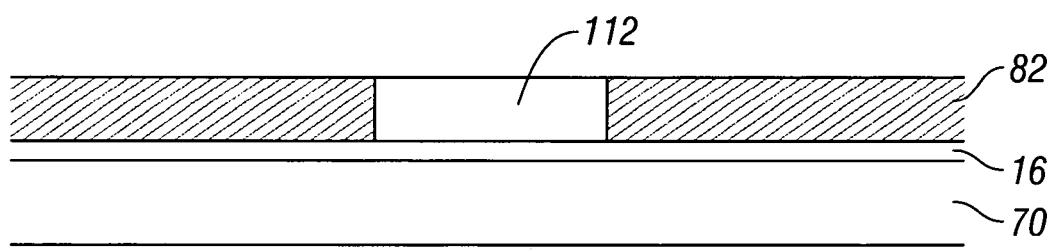

In certain embodiments, as can be seen in FIG. 9F, the spin-on layer 110 extends above the sacrificial layer 82. In those embodiments, the spin-on layer 110 may be etched back such that the layer 110 only fills the apertures 86, and does not extend over the remaining sacrificial material 82. In FIG. 9G, it can be seen that the layer has been blanket etched back without the need for a mask, forming inorganic posts 112 of the spin-on material. In this embodiment, the upper surface of these inorganic posts 112 is substantially coplanar with, or slightly below (e.g., less than 5% of the height of the sacrificial layer) the upper surface of the sacrificial layer 82.

Figure 9H:
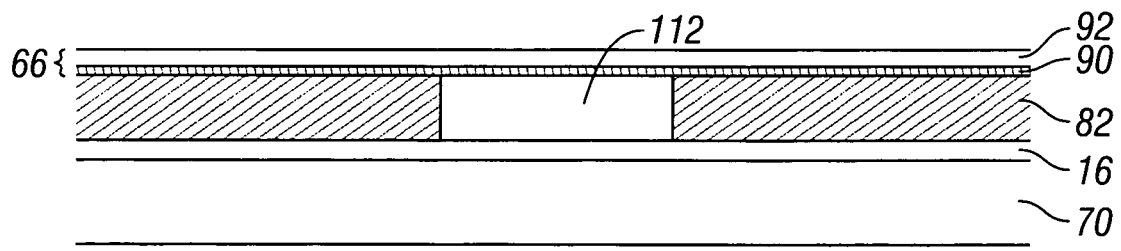

In FIG. 9H, it can be seen that the components which will form the movable layer 66 (see, e.g., moveable reflective layer 14 in FIG. 7A) are then deposited over the patterned sacrificial layer 82 and posts 112 In the embodiment of FIG. 9H, a highly reflective layer 90, also referred to as a mirror or mirror layer, is deposited first, followed by a mechanical layer 92. The highly reflective layer 90 may be formed from a specular metal, such as aluminum or an aluminum alloy, due to their high reflectance over a wide spectrum of wavelengths. The mechanical layer 92 may comprise a metal such as Ni and Cr, and is preferably formed such that the mechanical layer 92 contains residual tensile stress. The residual tensile stress provides mechanical force tending to pull movable layer 66 away from the optical stack 16 when the modulator is unactuated, or "relaxed." For convenience, the combination of the highly reflective layer 90 and mechanical layer 92 is collectively referred to as the movable layer 66, although it will be understood that the term movable layer, as used herein, also encompasses a partially separated mechanical and reflective layer, such as the mechanical layer 34 and the movable reflective layer 14 of FIG. 7C.

In an embodiment in which the sacrificial layer is to be etched or "released" by a $XeF_2$ etch, both the reflective layer 90 and the mechanical layer 92 are preferably resistant to $XeF_2$ etching. If either of these layers is not resistant, an etch stop layer may be used to protect the non-resistant layer surface exposed to the release etch.

In an alternate embodiment, the movable layer 66 may be a single layer which is both highly reflective and has the desired mechanical characteristics. However, the deposition of two distinct layers permits the selection of a highly reflective material, which might otherwise be unsuitable if used as the sole material in a movable layer 66, and similarly allows selection of a suitable mechanical layer without regard to its reflective properties. In yet further embodiments, the movable layer may comprise a reflective sublayer which is largely detached from the mechanical layer, such that the reflective layer may be translated vertically without bending (See, e.g., FIGS. 7C-7E and attendant description). One method of forming such an embodiment comprises the deposition of a reflective layer over the sacrificial layer, which is then patterned to form individual mirrors. A second layer of sacrificial material is then deposited over the reflective layer and patterned to permit the connections to be made through the second sacrificial layer between the subsequently deposited mechanical sublayer and the mirros, as well as to form apertures in the first sacrificial layer for support structures.

In other embodiments in which the MEMS devices being formed comprise non-optical MEMS devices (e.g., a MEMS switch), it will be understood that the movable layer 66 need not comprise a reflective material. For instance, in embodiments in which MEMS devices such as MEMS switches are being formed comprising the support structures discussed herein, the underside of the movable layer 66 need not be reflective, and may advantageously be a single layer, selected solely on the basis of its electrical and mechanical properties or other desirable properties.

Figure 9I:
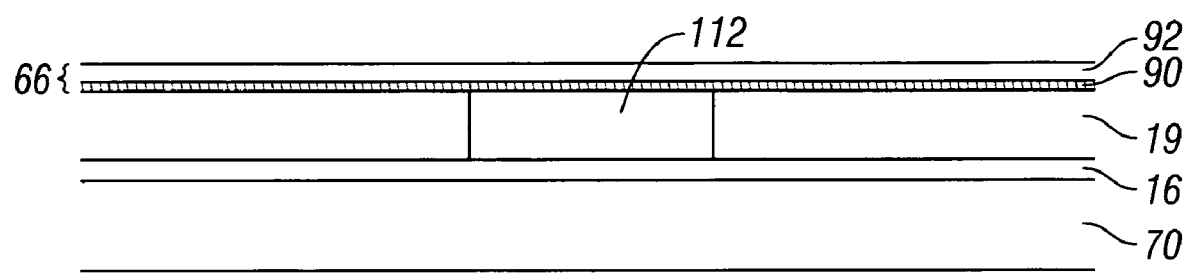

Finally, in FIG. 9I, it can be seen that a release etch is performed to remove the sacrificial layer, creating the interferometric gap 19 through which the movable layer 66 can move. In certain embodiments, a $XeF_2$ etch is used to remove the sacrificial layer 82. Because $XeF_2$ etches the preferred sacrificial materials well, and is extremely selective relative to other materials used in the processes discussed above, the use of a $XeF_2$ etch advantageously permits the removal of the sacrificial material with very little effect on the surrounding structures.

Thus, FIG. 9I depicts a portion of an interferometric modulator element such as one of the interferometric modulator elements 60 of FIG. 8, shown along line 9I-9I. In this embodiment, the movable layer 66 is supported throughout the gap 19 by support structures 112 formed over the movable layer 66. As discussed above, portions of the underlying optical stack 16 have advantageously been etched so as to minimize risk of shorting between conductive portions of the optical stack 16 and conductive layers in the movable layer 66, although this step need not be performed in all embodiments.

Figure 10:
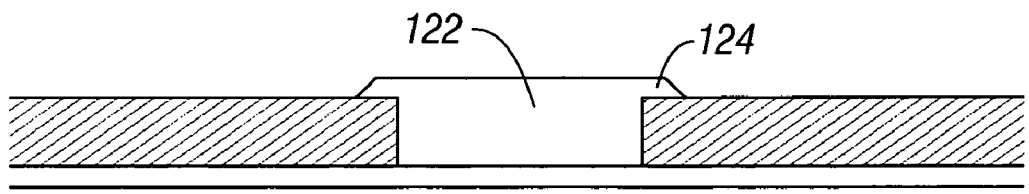
FIG. 10 is a schematic cross-sections illustrating a step in an alternate method for fabricating a MEMS device having a support structure formed from a self-planarizing material.

FIG. 10 depicts an alternate inorganic post 122 formed from spin-on material, in which a patterning and etching process, rather than a blanket etching back process, is used to form the support structure, and in which some of the spin-on layer overlying the sacrificial layer is not removed, such that the inorganic post 122 comprises "wings" 124 extending out over the sacrificial material 82. Because the layers deposited over the inorganic posts 122 are deposited over an uneven surface, the edges of these "wing" sections 124 are preferably tapered in order to facilitate the deposition of the additional layers. While not illustrated, it will be understood that a movable layer is subsequently deposited over the inorganic post 122 and sacrificial material 82 of FIG. 10.

Figure 11A:
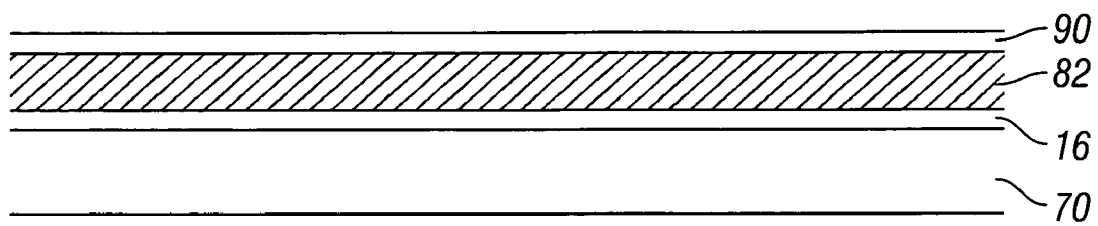
FIGS. 11A-11F are schematic cross-sections illustrating steps in a method for fabricating a MEMS device having an electrode which is partially separated from a mechanical layer.
Figure 11B:
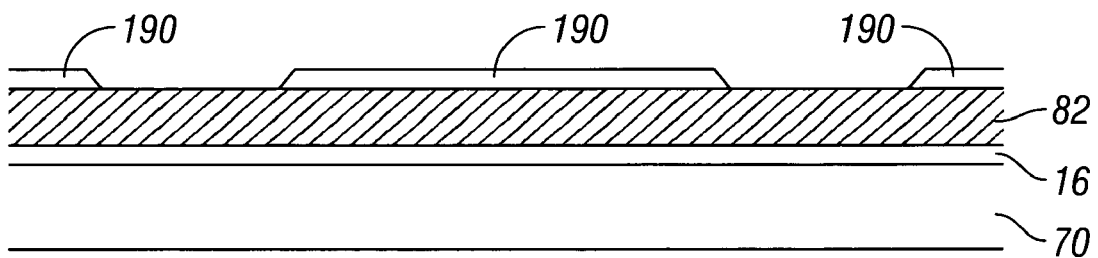
Figure 11C:
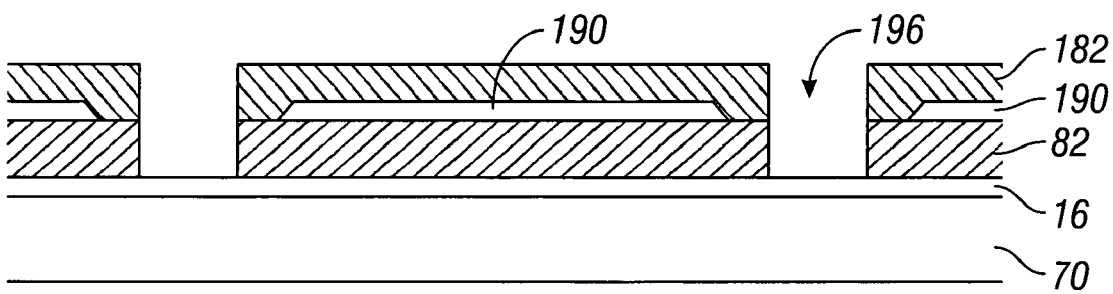

In another embodiment, a method for fabricating a MEMS device having an electrode which is partially detached from an overhanging mechanical layer is described with respect to FIGS. 11A-11F. This method includes the steps of FIGS. 9A-9D. In FIG. 11A it can be seen that a reflective layer 90 has been deposited over the sacrificial layer 82. In FIG. 11B, the reflective layer 90 of FIG. 11A has been patterned and etched to form isolated electrode member 190 (e.g., isolated mirrors). In FIG. 11C, an upper sacrificial layer 182 has been deposited over the patterned isolated electrode member, and both the upper sacrificial layer 182 and the lower sacrificial layer 82 are patterned to form apertures 196 extending through both sacrificial layers. As illustrated, these apertures 196 may comprise substantially vertical sidewalls.

Figure 11D:
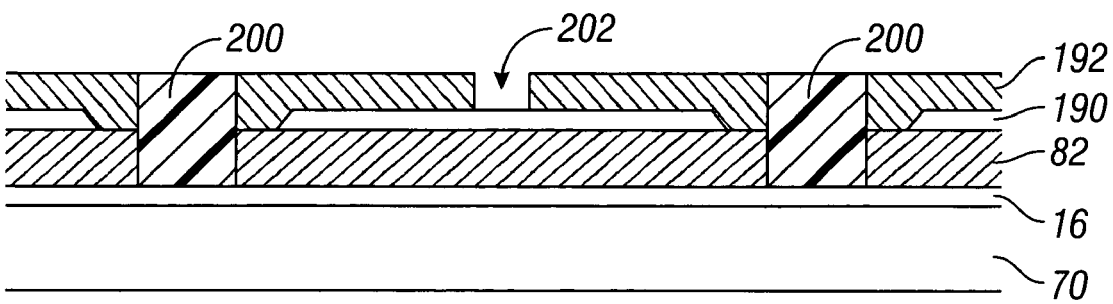

In FIG. 11D, support structures 200 comprising a self-planarizing material have been formed within the apertures 196. These support structures may be formed, for example, via the process described with respect to FIGS. 9F and 9G, wherein a layer of self-planarizing material is deposited over the patterned upper sacrificial layer 182 and then etched back or patterned to form the support structures 200. It can also be seen that a portion of the upper sacrificial layer 182 has been etched to form an aperture 202 exposing a portion of the isolated electrode member 190. In an alternate embodiment, the aperture 202 may be formed at the same time as the apertures 196, and any insulating material (e.g., the support structure material) deposited within the aperture 202 in an intervening step can be removed.

Figure 11E:
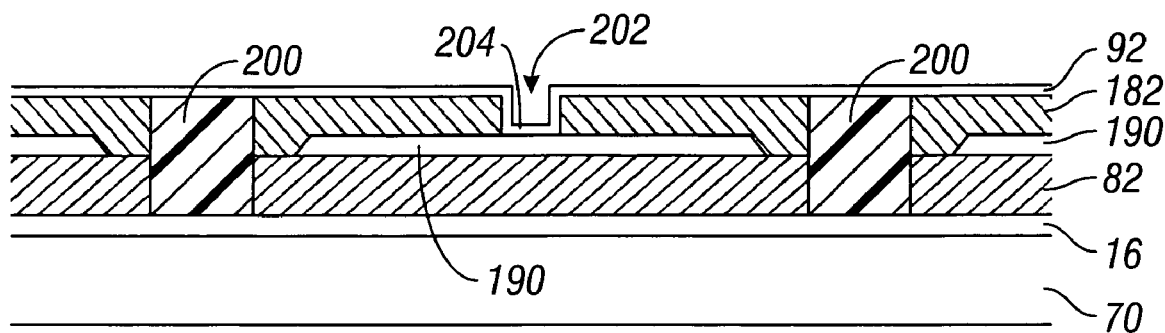
Figure 11F:
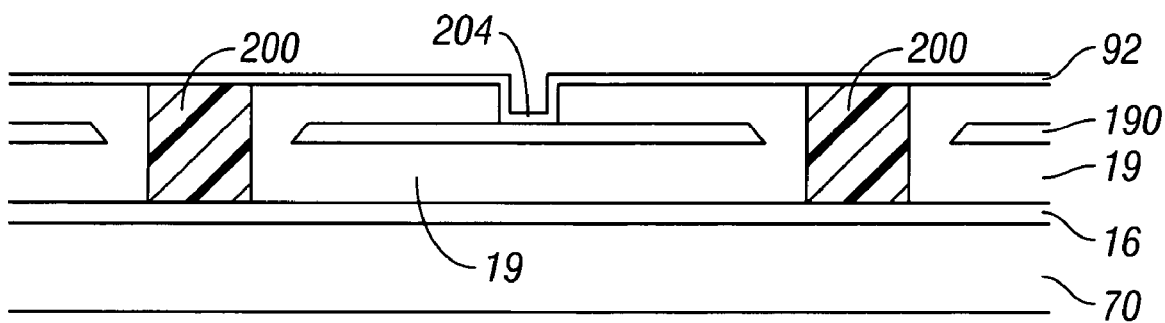

In FIG. 11E, it can be seen that a mechanical layer 92 has been deposited over the patterned upper sacrificial layer 182 and the support structures 200, such that the mechanical layer 90 fills a portion of the aperture 202, forming a connector portion 204 which provides mechanical support and electrical connection to the isolated electrode member 190. In FIG. 11F, the mechanical layer 90 has been patterned to form desired structures and the sacrificial layers 182 and 82 have been removed by a release etch, forming a MEMS device (e.g., an interferometric modulator in which an isolated electrode member 190 is spaced apart from the optical stack 16 by an air gap 19, and wherein a movable layer 66 includes a mechanical layer 92 and the isolated electrode member 190 which is partially detached from the mechanical layer.

Figure 12A:
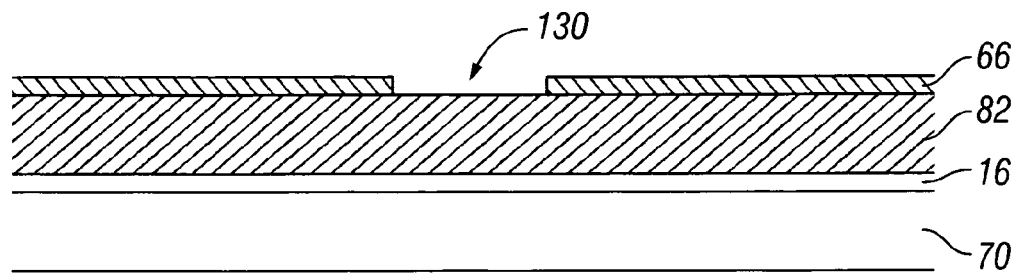
FIGS. 12A-12D are schematic cross-sections illustrating steps in a method for fabricating a MEMS device having a support structure which encloses at least a portion of a movable layer.

In another embodiment, depicted with respect to FIGS. 12A-12D, it can be seen that a planarizing material can be used to form a structure which provides support for a deformable reflective layer both from above and below the mechanical layer. This process includes the steps of FIGS. 9A-9D. In FIG. 12A, it can be seen that a movable layer 66, which in certain embodiments comprises a reflective layer and a mechanical layer (see FIG. 9H), has been deposited over the unpatterned sacrificial layer 82. The movable layer 66 has been patterned to form an aperture 130 extending through a portion of the movable layer 66 and exposing the underlying sacrificial layer 82.

Figure 12B:
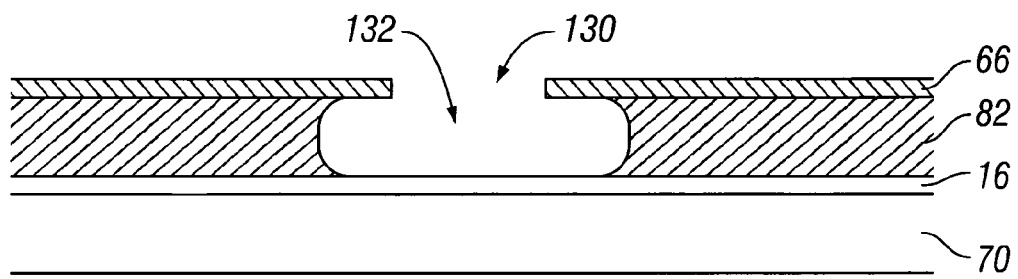

In FIG. 12B, it can be seen that the portions of the sacrificial layer 82 underlying the aperture 130 has been etched away, forming a cavity 132, and that this etch extends laterally into the sacrificial layer 82 near the apertures 130, such that the cavity 132 undercuts a portion of the layer 66. The skilled artisan will appreciate than an isotropic etch, selective against the mechanical layer 130 can accomplish such lateral recessing, although other suitable methods may also be used. It can also be seen that through the use of this etching process, a sidewall having a reentrant profile is formed, in that the width of the cavity 132 is narrower at a point immediately beneath the movable layer 66 than it is at a point lower in the cavity 132.

Figure 12C:
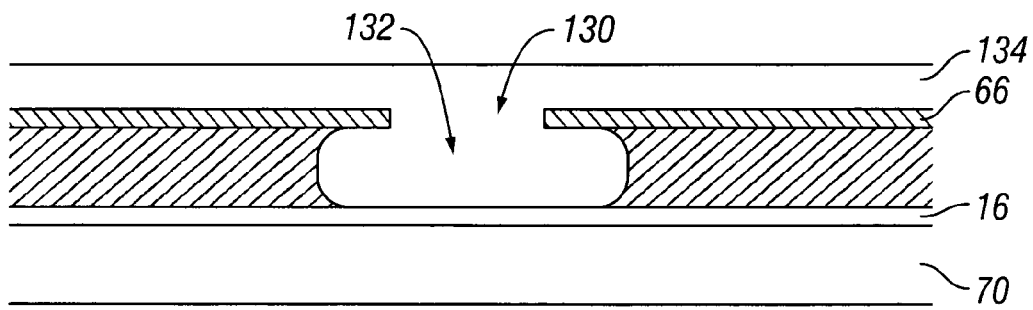

In FIG. 12C, a layer 134 of spin-on material has been deposited, such that it flows through the apertures 130 to fill the cavities 132, and also extends over the movable layer 66. Other self-planarizing materials can also be used, as discussed with respect to FIG. 9A-9I. It can be seen that the spin-on material flows to conform to the shape of the cavity 132, such that the spin-on material assumes a convex shape within the cavity 132 corresponding to the concave profile formed by the etch which creates the cavity 132. Other deposition methods employing liquid precursors (e.g., electroless or electroplating) can similarly fill the cavity 132 despite the overhanging movable layer 66 and the re-entrant profile. The deposition of the spin-on material may comprise any of the methods discussed above, including exposure of the partially fabricated MEMS device to a liquid precursor.

Figure 12D:
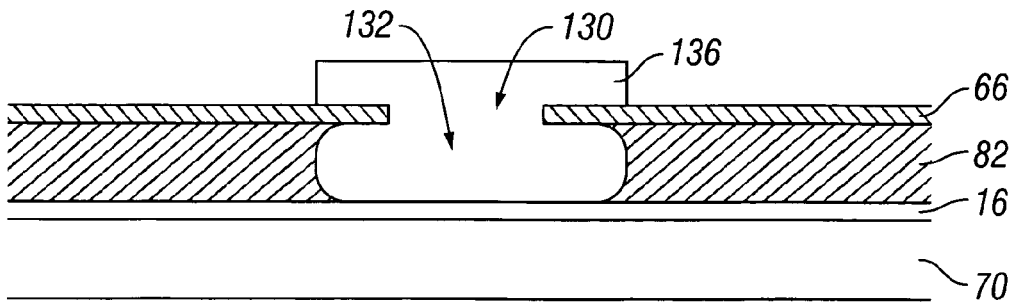

In FIG. 12D, the spin-on layer 134 is patterned and etched to remove the spin-on material located away from the apertures 130, leaving a support structure 136 extending both over and underneath portions of the movable layer 66, partially enclosing the edges of the movable layer 66. In later steps, as discussed above with respect to FIG. 9J, a release etch may be performed in order to remove the sacrificial layer 82. Advantageously, this embodiment provides improved adhesion between the support structure and the movable layer 66, as well as a substantially or completely flat mechanical layer, which permits better control over the size of the interferometric cavity.

In the illustrated embodiment, it can be seen that the diameter of the upper portion of the support structure 136 is substantially the same as the diameter of the lower portion of the support structure 136. However, in alternate embodiments, it will be understood that both the size and shapes of the upper and lower portions of the support structure may vary, and that the upper and lower portions of the support structure 136 need not be symmetrical with respect to one another.

In addition to the spin-on materials discussed above, it will be understood that the support structure 136 may also comprise a polymeric planarization material such as photoresist. Advantageously, the use of a polymeric planarization material simplifies the fabrication process as the deposition and exposure of an additional mask layer overlying the support structure layer is not necessary. Because the edge of the mechanical layer is partially enclosed by the support structure 136, degradation of the support provided by such a polymeric support structure over time is not as much of a concern as it is in embodiments in which a polymeric post structure merely underlies a movable layer. In an embodiment in which a polymeric post underlies a movable layer, adhesion between the polymeric post and the movable layer may be poor. By providing a support structure having overlying polymeric material in addition to the underlying polymeric material, the adhesion between the support structure and the movable layer is greatly improved, leading to better control of the size of an air gap over prolonged periods of time.

In a variation of the above method, an underlying support structure may be formed through, for example, the application of a liquid precurspor (e.g., spin-on deposition) to form a layer which fills the cavity 132 of FIG. 12B but does not extend above the movable layer, or through the use of a blanket etch to etch back the portions of the spin-on layer extending over the movable layer such that the upper surface of the spin-on support structure is at or below the upper surface of the movable layer.

Figure 13:
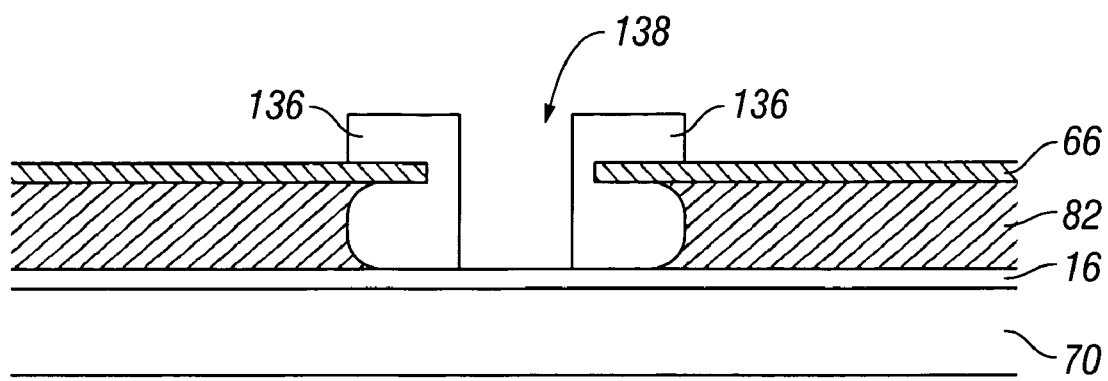
FIG. 13 is a schematic cross-section illustrating a step in a method for fabricating a MEMS device having a support structure which includes an aperture extending through the support structure.

FIG. 13 depicts a stage in a further embodiment of a method for forming support structures from self-planarizing material. In FIG. 13, after performing the steps of FIGS. 12A-12C, in place of the step of FIG. 12D, it can be seen that at the same time that the spin-on layer 134 is patterned to form the support structures 136, a portion of the spin-on layer 134 extending through the aperture 130 is removed, forming an aperture 138 extending through the support structure 136. In embodiments in which the support structure comprises a sufficiently rigid material, the support structure 136 can be bifurcated, forming two support structures. In such an embodiment, the support structures may comprise a conductive self-planarizing material, and still support two electrically isolated portions of the movable layer without shorting between the two isolated portions as may be desirable for posts or rails at the edges of upper electrode strips.

Figure 14A:
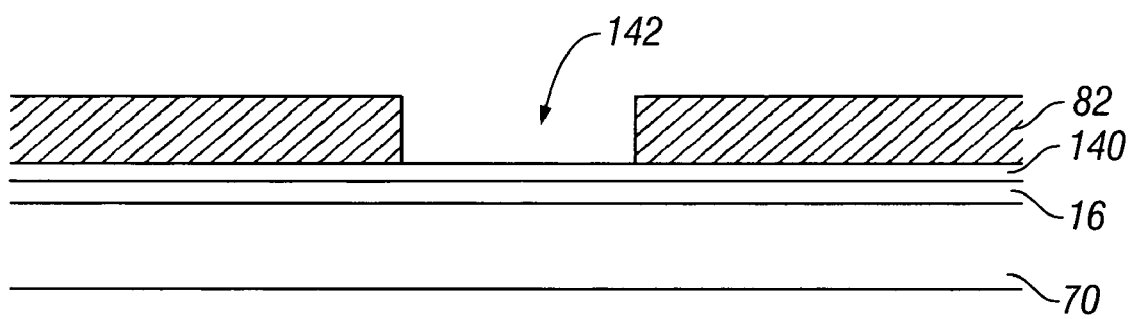
FIGS. 14A-14B are schematic cross-sections illustrating steps in an alternate method for fabricating a MEMS device having a support structure formed by an electroplating process.

In other embodiments, electroplating can be used to form support structures which may have substantially vertical sidewalls. In one embodiment, described with respect to FIGS. 14A-14B, a seed layer deposited prior to the deposition and patterning of the sacrificial layer, and the sacrificial layer is used as a mask during an electroplating process. In FIG. 14A, it can be seen that a metallic seed layer 140 has been deposited over the optical stack 16, and that a sacrificial layer 82 has been deposited over the seed layer 140 and patterned to form an aperture 142 extending through the sacrificial layer 82 and exposing a portion of seed layer 140. In the illustrated embodiment, the apertures 142 have substantially vertical sidewalls, although it will be understood that the shape of the aperture will be determined at least in part by the etching process.

Figure 14B:
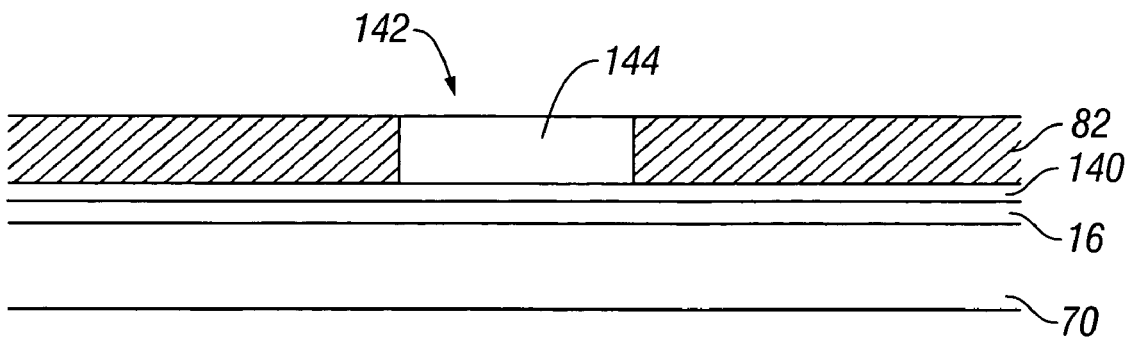

In FIG. 14B, it can be seen that a plating process, such as an electroplating process, has been used to form a support structure 144 within the aperture 142, the support structure taking the shape of the aperture 144. In such an embodiment, it will be understood that the sacrificial material is preferably an insulating material which will not be plated during the electroplating process or is protected by an additional layer (not shown) in order to avoid being plated. Fabrication of the support structure may continue as discussed with respect to other embodiments, above, forming a MEMS device having a movable layer supported by an underlying post which may have substantially vertical sidewalls, as depicted.

Figure 19:
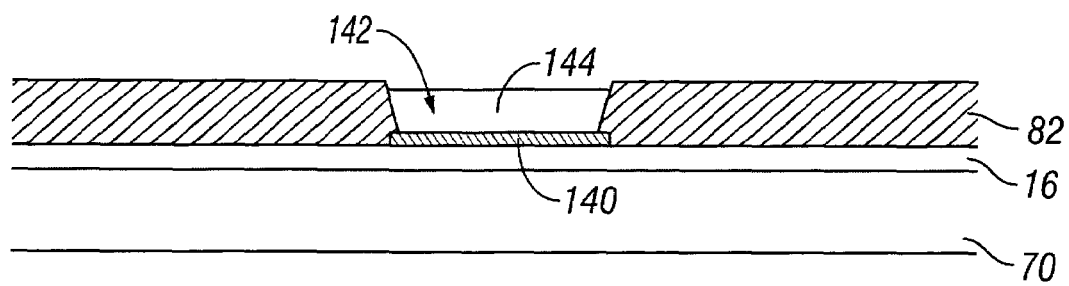
FIG. 19 is a schematic cross-section illustrating a step in an alternate method for fabricating a MEMS device having a support structure formed by an electroplating process

In a further embodiment, shown in FIG. 19, it can be seen that the seed layer 140 has been patterned prior to deposition of the sacrificial layer 82, such that the metallic seed layer 140 underlies only the portions of the sacrificial layer 82 surrounding the support structure 144, which is formed by a selective plating process. Although the underlying seed layer may comprise isolated sections of the seed layer 140, as illustrated, it will be understood that electroplating may be utilized when the sacrificial layer 82 comprises a conductive material, such as molybdenum, tantalum, or doped silicon.

Through proper selection of the seed layer 140 and the sacrificial layer 82, plating can be controlled to only occur on the seed layer, and not on the conductive sacrificial layer 82. In one exemplary embodiment, the sacrificial layer 82 comprises tantalum, and the metallic seed layer 140 comprises copper.

Figure 20A:
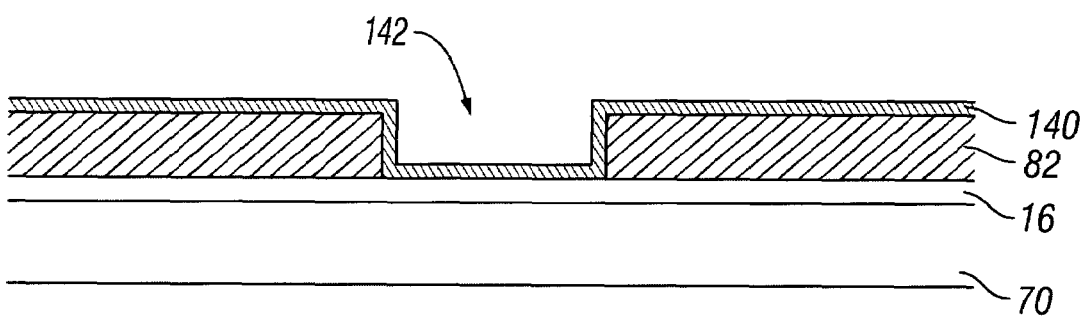
FIGS. 20A-20C are schematic cross-sections illustrating steps in an alternate method for fabricating a MEMS device having a support structure formed by an electroplating process.
Figure 20B:
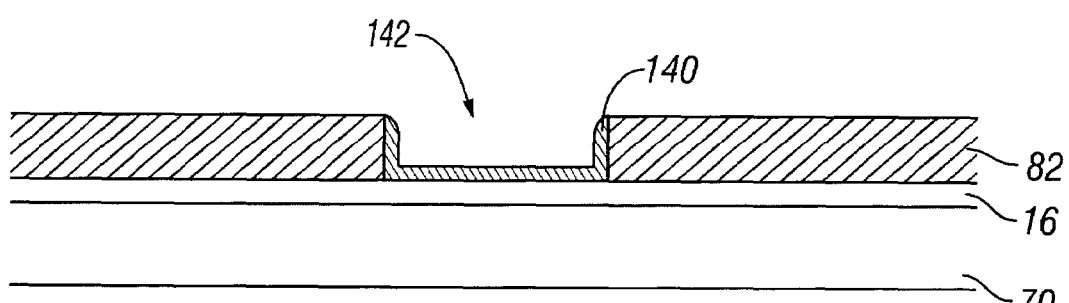
Figure 20C:
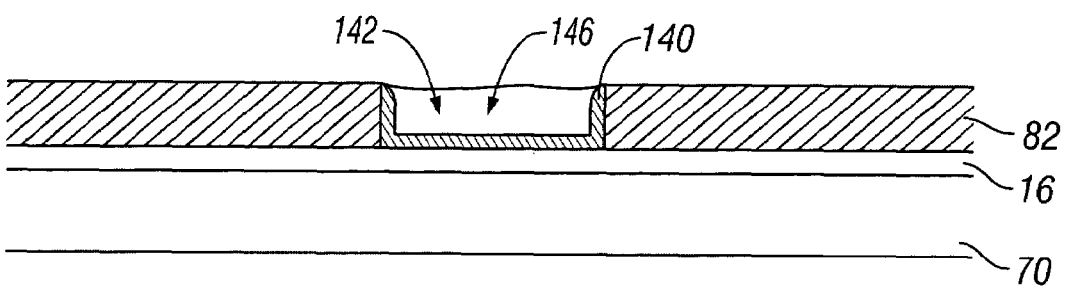

FIGS. 20A-20C depict an alternate plating process for forming support structures having desired shapes. In FIG. 20A, it can be seen that an insulating sacrificial layer 82 has been deposited over an optical stack 16 and patterned to form apertures 142 which may have substantially vertical sidewalls, as depicted, and that a seed layer 140 is deposited over the patterned sacrificial layer 82. In one embodiment, the seed layer may cover the sidewalls of the aperture 142, as shown in the illustrated embodiment.

In FIG. 20B, the portions of the seed layer 140 located away from the aperture 142 are removed, such that the seed layer 140 coats the interior surfaces of the aperture 142. In FIG. 20C, a plating process is used to form a support structure 146 within the aperture 142. Because the seed layer 140 is only located within the aperture 142, the support structure 146 will not extend beyond the edges of the aperture 142. Because isolated portions of the seed layer 140 are being plated, an electroplating process can be used when the sacrificial layer 82 comprises a conductive material, and when the seed layer 140 can be selectively plated with respect to the sacrificial material 82. Fabrication of the support structure may continue as discussed with respect to other embodiments, above, including the formation of a movable layer supported by support structures 146.

Figure 15A:
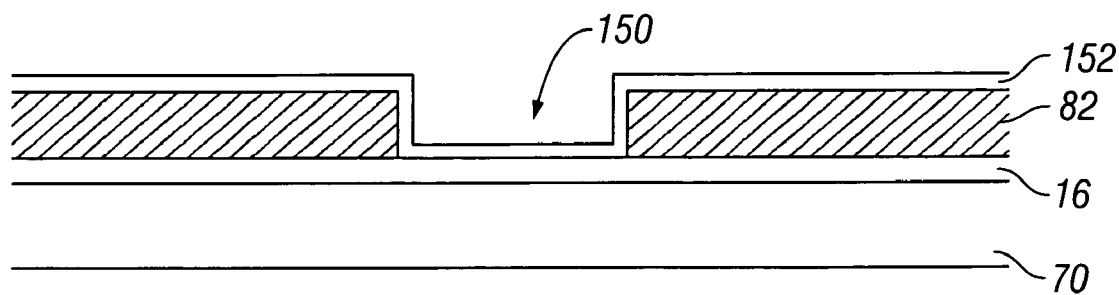
FIGS. 15A-15C are schematic cross-sections illustrating steps in a method for fabricating a MEMS device having spacers formed by a spacer etch.
Figure 15B:
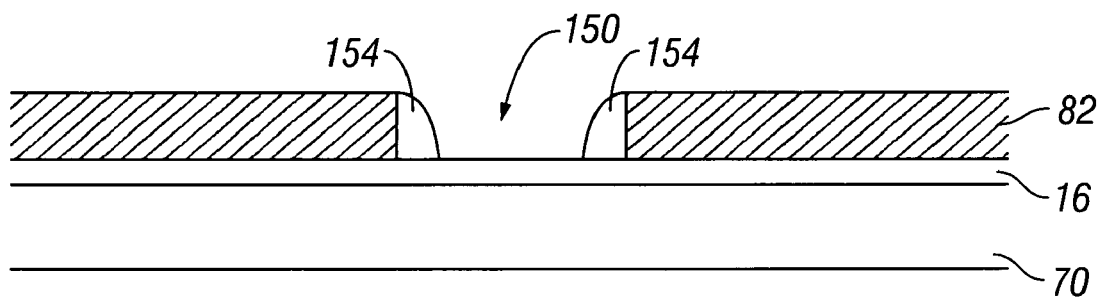
Figure 15C:
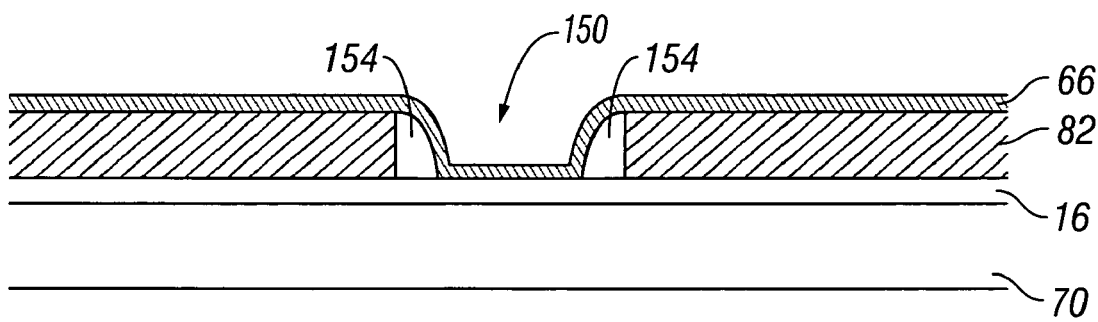

In another embodiment, a directional etch may be used to form spacer structures which provide support for a mechanical layer or deformable reflective layer. FIGS. 15A-15C depict a method for forming such spacer supports. In FIG. 15A, it can be seen that a layer of sacrificial material 82 has been deposited over an optical stack 16 and etched to form apertures 150. In the present embodiment, it can be seen that the aperture 150 may comprise substantially vertical sidewalls. A conformal layer of support material 152 is deposited over the patterned sacrificial layer. In certain embodiments, this layer 152 may comprise an insulating material, such as $SiN_x$ or $SiO_2$, but a wide variety of support materials may be suitable.

In FIG. 15B, it can be seen that the support material 152 has been anisotropically etched downward, so as to preferentially remove the horizontal portions of support material 152, but leaving a portion of the vertical portions remaining to form spacers 154 (which in the illustrated embodiment may be a single annular spacer located along the sidewall of each aperture 150). In one embodiment, a reactive ion etch may be utilized to achieve the desired anisotropic etching, but other anisotropic etching methods (e.g., sputter etching) may alternately be utilized. The spacers formed by the spacer etch have a rounded or sloped interior surface while the outer surface is substantially vertical, and thus define tapered or narrowed width of the spacers at their upper regions.

In FIG. 15C, a movable layer 66, which in certain embodiments may comprise a reflective layer 90 and a mechanical layer 92, is then deposited over the patterned sacrificial layer 82, such that the spacer 154 serves as a support structure underneath the movable layer 66. The movable layer 66 is conformal over the spacer 154, and in particular directly over the tapered interior surface of the spacer 154 and the exposed portions of the optical stack 16. The portion of the movable layer in the aperture 150 is more easily deposited over the sloped spacer 154, due to the tapered interior surface of the spacer 154. Advantageously, because the aperture 150 need not be tapered, due to the sloped spacer 154, it can be seen that the edge of the spacer 342 comprises a substantially vertical edge. Since the support structure does not comprise an overhang, the likelihood that actuation of the movable layer 66 will cause the edge of the post to flex downward is greatly reduced. In addition, because the support structure 154 has a substantially vertical outer surface, the usable area of the device may be larger than had the support structure included a tapered outer surface or an overhang.

Figure 16A:
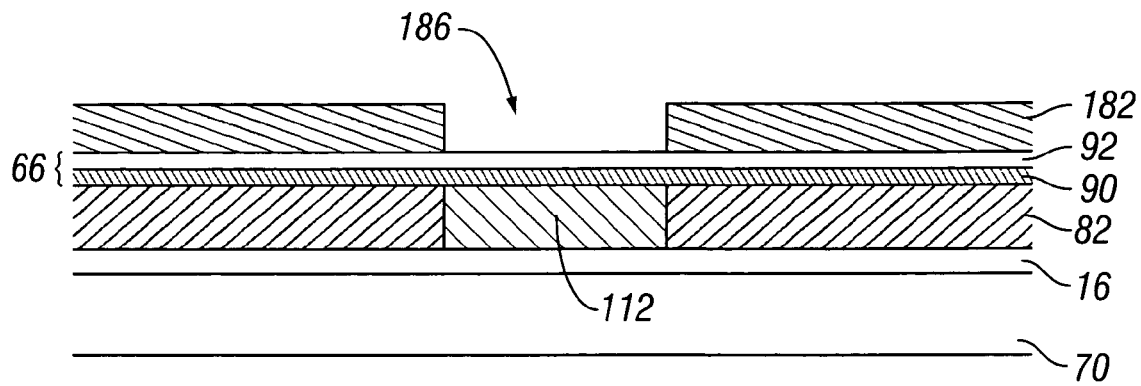
FIGS. 16A-16C are schematic cross-sections illustrating steps in a method for fabricating a MEMS device having an overlying rigid ceiling member.
Figure 16B:
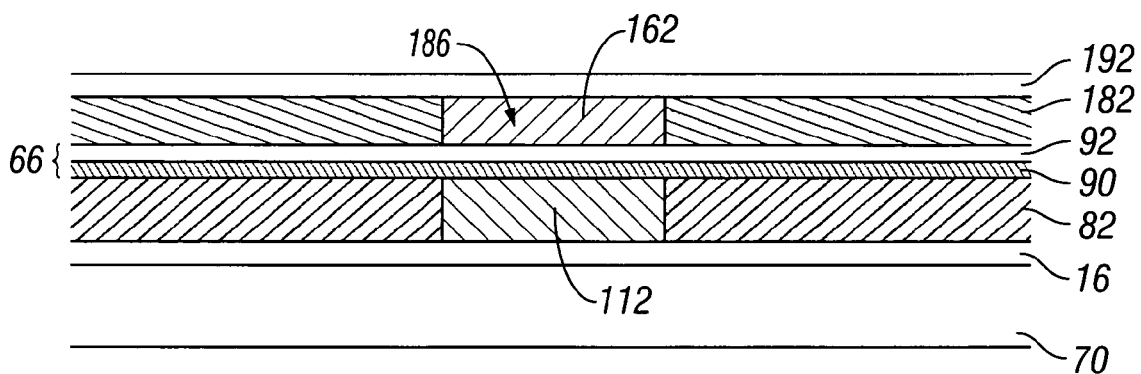
Figure 16C:
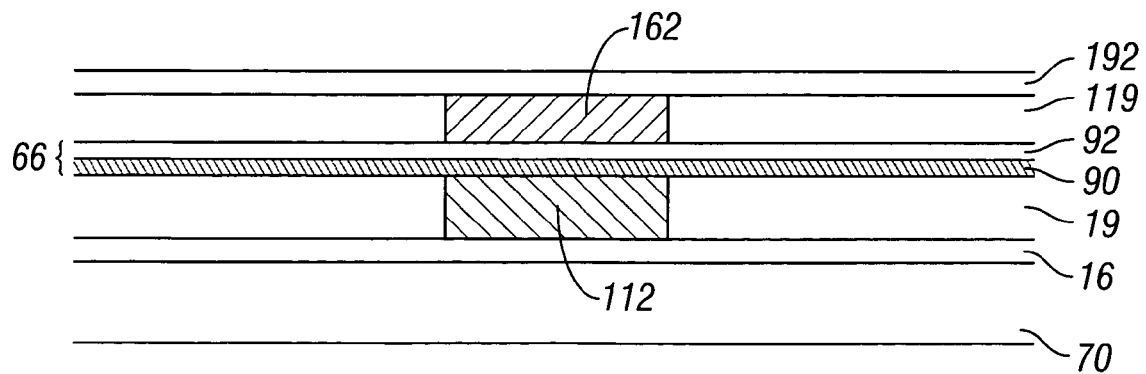

In MEMS devices such as interferometric modulators, in which the size of the air gap between an electrode layer and a movable layer affects the color reflected by the device in a relaxed position, it is desirable to ensure that the movable layer does not flex upward beyond a desired position. FIGS. 16A-16C depict a method for fabricating such a structure, which in the illustrated embodiment includes the steps of FIGS. 9A-9H, but which in other embodiments may include any suitable method for forming a movable layer supported by underlying support structures.

In FIG. 16A, it can be seen that an upper layer of sacrificial material 182 is deposited over the movable layer 66, and patterned to form apertures 186, which overlie at least some of the underlying post structures 112. The post structures 112 can thus provide support for the overlying support structures which will be formed, and so that the overlying post structures do not overlie the active areas of the display. It will be understood that, in embodiments employing hanging electrodes (e.g., mirrors) below a mechanical layer, the upper sacrificial layer can be the third sacrificial layer in the device, and an intermediate sacrificial layer may be used to space a portion of the hanging electrode apart from a mechanical layer. In the illustrated embodiment, the apertures 186 are depicted as having substantially vertical sidewalls, although apertures having different shapes may be used, examples of which are discussed below with respect to FIGS. 17A-17B. The thickness of the deposited upper sacrificial layer 182 may vary based on the operating parameters of the MEMS device, but in certain embodiments, the thickness of the deposited upper sacrificial layer is preferably between 30 and 500 angstroms, and more preferably between 50 and 200 angstroms, in order to minimize expansion of the underlying optical cavity being formed, although it will be understood that thicknesses both inside and outside of that range may be suitable for a given application and may be used.

In FIG. 16B, it can be seen that a support structure 162 overlying the movable layer 66 has been formed within the aperture 186. The upper support structure 162 may be formed by a method such as that discussed with respect to FIGS. 9F-9G, wherein a layer of self-planarizing material (see layer 110 in FIG. 9F) is deposited over the patterned sacrificial layer 182 and then blanket etched back to form the upper support structure 162. A ceiling layer 192 is then deposited over the upper support post 162. The ceiling layer 192 is preferably a rigid, insulating layer, such as an inorganic oxide layer (e.g., a form of silicon oxide), so as to prevent deformation of the ceiling layer 192 itself by a movable layer 66 pressing upwards against the ceiling layer 192, and to prevent shorting between otherwise electrically isolated portions of the movable layer 66. In certain embodiments, to aid rigidity, the ceiling layer 192 may be roughly 2-5 times, more preferably about 3 times the thickness of the movable layer 66, although it will be understood that the desirable thickness of the ceiling layer 192 will vary based on the composition of both the ceiling layer 192 and the movable layer 66. In order to minimize deflection of the ceiling layer 192 itself, the ceiling layer may be formed from a single layer, or may be formed from a plurality of symmetrical layers (not shown), such that the upper layers of the ceiling layer are the substantially same material and thickness as the lower layers of the ceiling layer, and the ceiling layer 192 is roughly a mirror image about a neutral axis.

In FIG. 16C, it can be seen that a release etch has been performed to remove the lower sacrificial layer 82 and the upper sacrificial layer 182, forming a gap 19 between the movable layer 66 and the electrode layer within the optical stack 16, as well as an upper gap 119 between the movable layer 66 and the rigid ceiling layer 192. Both the movable layer 66 and the ceiling layer 192 are supported by a support structure comprising the upper support structure or segment 162 and the lower support structure or segment 112. The height of the upper gap 119 is dependent on the height of the second sacrificial layer 182 (see FIG. 16B), and preferably made as small as possible without being so small as to result in undesirable stiction between the movable layer 66 and the ceiling layer 192, or otherwise inhibiting the operation of the MEMS device. In a further embodiment, the movable layer 66 can be deposited such that the movable layer 66 is designed, upon release, to flex upward against the rigid ceiling layer 192 when the device is in a relaxed, or unactuated, position. Such an embodiment ensures that the movable layer 66 will remain at a desired distance from the electrode layer when in a relaxed height, providing uniformity both within a MEMS element and across an array of MEMS elements.

Figure 17A:
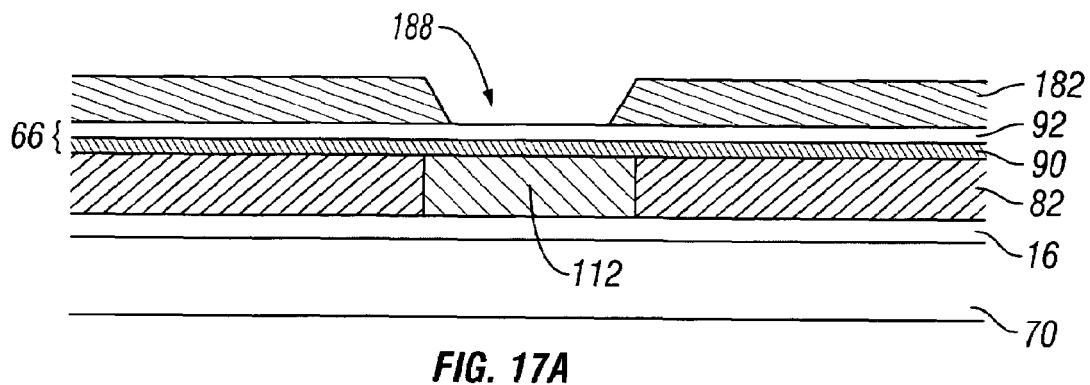
FIGS. 17A-17B are schematic cross-sections illustrating steps in an alternate method for fabricating a MEMS device having an overlying rigid ceiling member.
Figure 17B:
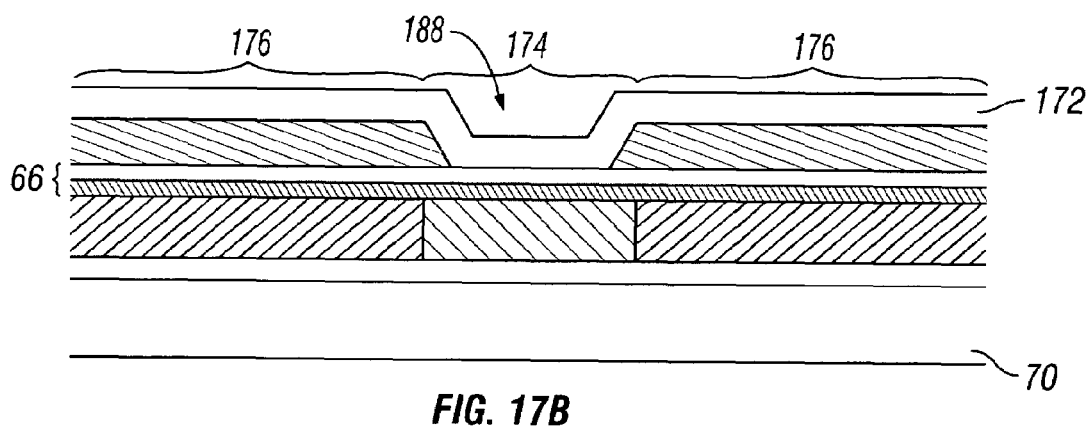

FIGS. 17A-17B illustrate an alternate method of forming a MEMS device comprising a ceiling layer, which again includes the steps of FIGS. 9A-9H or any suitable alternative methods. In FIG. 17A, it can be seen that an upper layer of sacrificial material 182 (having a thickness as described with respect to FIG. 16) has been deposited over the movable layer 66, and patterned to form apertures 188, which in this embodiment comprise tapered sidewalls. In FIG. 17B, a layer of conformal support material 172 has been deposited over the patterned upper sacrificial layer 182, such that support structures are formed from the support material within support regions 174, and the support material extends over the substantially flat portions of the sacrificial layer 192 in ceiling regions 176. The process may then continue as discussed with respect to FIG. 16C, wherein a release etch is performed to form gaps between the movable layer 66 and both the electrode within the optical stack 16 and the ceiling regions 176. A support structure is thus formed which includes a lower support segment 112 and an upper support segment 174 which is a part of the ceiling layer itself. In a further embodiment (not shown), support layer 172 may be patterned to form isolated support segments, and a separate ceiling layer may be deposited over these isolated support segments.

Figure 18:
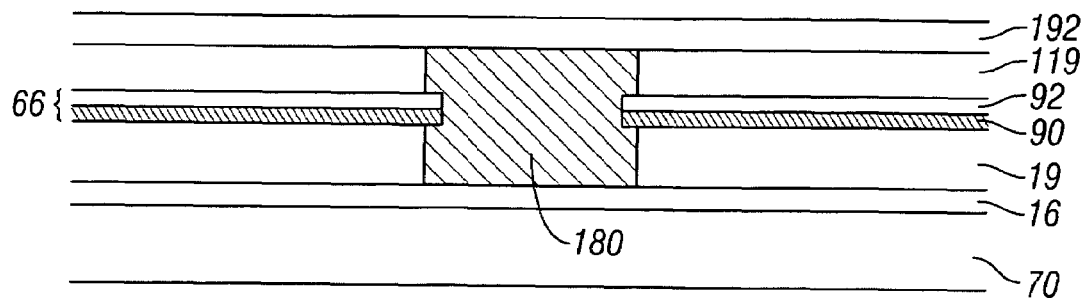
FIG. 18 is a schematic cross-section illustrating a step in an alternate method for fabricating a MEMS device having an overlying rigid ceiling member.

FIG. 18 illustrates another embodiment of a MEMS device comprising a ceiling layer. In the illustrated embodiment, a single contiguous support structure 180 extends at least through the movable layer 66, enclosing a portion of the movable layer 66. Such an embodiment may be formed, for example, through the deposition of a lower sacrificial layer, followed by the deposition of a movable layer 66, followed by the deposition of an upper sacrificial layer. A via or aligned vias can be etched through each of those layers, forming a single cavity extending through all three layers, which can then be filled with a self-planarizing material in which the movable layer 66 is embedded. In a further embodiment, a via may be formed through the ceiling layer 192, as well, and the support structure 180 may enclose or embed a portion of the ceiling layer 192. In addition to the embodiments discussed above, it will be understood that a wide variety of alternate support structures and methods of fabricating the same may also be used to space a rigid ceiling layer apart from the movable layer.

It will be understood that various combinations of the above embodiments are possible. Various other combinations of the support structures discussed above are contemplated and are within the scope of the invention. In addition, it will be understood that support structures formed by any of the methods above may be utilized in combination with other methods of forming support structures, in order to improve the rigidity and durability of those support structures, or to minimize deflection due to stress mismatches.

It will also be recognized that the order of layers and the materials forming those layers in the above embodiments are merely exemplary. Moreover, in some embodiments, other layers, not shown, may be deposited and processed to form portions of an MEMS device or to form other structures on the substrate. In other embodiments, these layers may be formed using alternative deposition, patterning, and etching materials and processes, may be deposited in a different order, or composed of different materials, as would be known to one of skill in the art.

It is also to be recognized that, depending on the embodiment, the acts or events of any methods described herein can be performed in other sequences, may be added, merged, or left out altogether (e.g., not all acts or events are necessary for the practice of the methods), unless the text specifically and clearly states otherwise.

While the above detailed description has shown, described, and pointed out novel features of the invention as applied to various embodiments, it will be understood that various omissions, substitutions, and changes in the form and details of the device of process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of fabricating a MEMS device, comprising:
providing a substrate;
depositing an electrode layer over the substrate;
depositing a sacrificial layer over the electrode layer;
patterning the sacrificial layer to form an aperture;
depositing a layer of inorganic self-planarizing material over the sacrificial layer, such that it completely fills the aperture;
etching back the layer of self-planarizing material to a level at or below the upper surface of the sacrificial layer to form a support structure; and
depositing a movable layer over the support structure.

2. The method of claim 1, additionally comprising performing a release etch to remove the sacrificial layer, forming an air gap located between the movable layer and the electrode layer.

3. The method of claim 1, wherein the aperture comprises substantially vertical sidewalls.

4. The method of claim 1, wherein patterning the layer of self-planarizing material to form a support structure comprises etching back the layer of self-planarizing material to a level at or below the upper surface of the sacrificial layer.

5. The method of claim 1, wherein depositing a movable layer over the support structure comprises depositing a reflective sublayer over the support structures and depositing a mechanical sublayer over the reflective sublayer.

6. The method of claim 1, wherein depositing a movable layer over the support structure comprises:

depositing an upper electrode layer over the sacrificial layer;

patterning the upper electrode layer to form isolated electrode members; and depositing an upper sacrificial layer over the isolated electrode members, wherein the upper sacrificial layer is deposited prior to patterning the sacrificial layer to form the aperture, and wherein patterning the sacrificial layer to form the aperture comprises patterning both the upper sacrificial layer and the lower sacrificial layer.

7. The method of claim 6, wherein the upper electrode layer comprises a reflective layer.

8. The method of claim 6, additionally comprising patterning the upper sacrificial layer to form an aperture exposing a portion of the isolated electrode member; and forming a mechanical layer over the support structure and the patterned upper sacrificial layer, wherein a portion of the mechanical layer is in contact with the exposed portion of the isolated electrode member.

9. The method of claim 1, wherein the MEMS device comprises an interferometric modulator.

10. A MEMS device formed by the method of claim 1.

* * * * *